US007954233B2

(12) United States Patent
Maenishi

(10) Patent No.: US 7,954,233 B2
(45) Date of Patent: Jun. 7, 2011

(54) METHOD FOR COMPONENT MOUNTING

(75) Inventor: Yasuhiro Maenishi, Saga (JP)

(73) Assignee: Panasonic Corporation, Osaka (JP)

( * ) Notice: Subject to any disclaimer, the term of this patent is extended or adjusted under 35 U.S.C. 154(b) by 105 days.

(21) Appl. No.: 12/513,556

(22) PCT Filed: Nov. 2, 2007

(86) PCT No.: PCT/JP2007/071748
§ 371 (c)(1),
(2), (4) Date: May 5, 2009

(87) PCT Pub. No.: WO2008/056754
PCT Pub. Date: May 15, 2008

(65) Prior Publication Data
US 2010/0064511 A1 Mar. 18, 2010

(30) Foreign Application Priority Data
Nov. 9, 2006 (JP) .................................. 2006-304389

(51) Int. Cl.
*H05K 3/30* (2006.01)
(52) U.S. Cl. .............................. 29/832; 29/833; 29/840
(58) Field of Classification Search .................... 29/825, 29/832, 833, 840
See application file for complete search history.

(56) References Cited

U.S. PATENT DOCUMENTS

| 5,566,447 | A | * | 10/1996 | Sakurai ........................... 29/832 |
| 5,778,525 | A | | 7/1998 | Hata et al. |
| 5,830,186 | A | * | 11/1998 | Gonzales et al. ............. 604/131 |
| 6,408,505 | B1 | | 6/2002 | Hata et al. |
| 6,729,017 | B1 | | 5/2004 | Kashiwagi et al. |
| 6,789,310 | B1 | | 9/2004 | Hata et al. |
| 6,918,176 | B2 | | 7/2005 | Nagao et al. |
| 6,935,017 | B2 | | 8/2005 | Hata et al. |
| 6,948,232 | B1 | * | 9/2005 | Yazawa et al. .................. 29/740 |
| 6,971,157 | B1 | | 12/2005 | Yoshida et al. |
| 7,003,872 | B2 | * | 2/2006 | Mimura et al. ................. 29/832 |
| 7,025,244 | B2 | * | 4/2006 | Haji ................................. 228/9 |
| 7,069,648 | B2 | | 7/2006 | Hata et al. |
| 7,100,278 | B2 | | 9/2006 | Hata et al. |

(Continued)

FOREIGN PATENT DOCUMENTS
JP 9-130084 5/1997
(Continued)

OTHER PUBLICATIONS

International Search Report issued Mar. 4, 2008 in the International (PCT) Application of which the present application is the U.S. National Stage.

(Continued)

*Primary Examiner* — C. J Arbes
(74) *Attorney, Agent, or Firm* — Wenderoth, Lind & Ponack, L.L.P.

(57) ABSTRACT

A method for component mounting which reduces the length of time that a component mounter called alternate mounting component mounter takes for mounting components is a method for component mounting used for a component mounter including plural mounting heads which alternately mount components onto a board. The method includes specifying, as a first mounting head, one of the plural mounting heads which moves a shortest distance to the board (S2), and mounting the components onto the board which is brought into the component mounter, the mounting starting from the first mounting head (S14).

5 Claims, 25 Drawing Sheets

U.S. PATENT DOCUMENTS

| | | |
|---|---|---|
| 7,120,996 B2 | 10/2006 | Hata et al. |
| 7,200,925 B2 | 4/2007 | Hata et al. |
| 7,222,774 B2 * | 5/2007 | Haji .......................... 228/112.1 |
| 7,640,657 B2 | 1/2010 | Van Gastel |
| 2002/0017020 A1 | 2/2002 | Hata et al. |
| 2002/0092157 A1 | 7/2002 | Yoshida et al. |
| 2002/0112346 A1 | 8/2002 | Hata et al. |
| 2002/0138977 A1 | 10/2002 | Nagao et al. |
| 2004/0237297 A1 | 12/2004 | Hata et al. |
| 2004/0255453 A1 | 12/2004 | Hata et al. |
| 2006/0016067 A1 | 1/2006 | Yoshida et al. |
| 2006/0200979 A1 | 9/2006 | Hata et al. |
| 2008/0250635 A1 | 10/2008 | Van Gastel |

FOREIGN PATENT DOCUMENTS

| | | |
|---|---|---|
| JP | 2001-15988 | 1/2001 |
| JP | 2002-299889 | 10/2002 |
| JP | 2003-501844 | 1/2003 |
| JP | 2003-204191 | 7/2003 |
| JP | 2003-204192 | 7/2003 |
| JP | 2004-128245 | 4/2004 |
| JP | 2004-186391 | 7/2004 |
| JP | 2006-253536 | 9/2006 |
| WO | 00/78114 | 12/2000 |

OTHER PUBLICATIONS

Patent Cooperation Treaty (PCT) International Preliminary Report on Patentability, issued Feb. 17, 2009.

Patent Cooperation Treaty (PCT) Written Opinion of the International Searching Authority, issued Mar. 4, 2008.

First Reply (in English language) issued Mar. 4, 2008 in the International (PCT) Application of which the present application is the U.S. National Stage.

* cited by examiner

FIG. 6

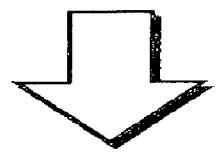

Mounting point pi = (Component type ci, X-coordinate xi,
Y-coordinate yi, Monting angle $\theta i$,
Control data $\phi i$)

Mounting point data
is list of mounting points pi $$\text{Mounting point data} = \begin{pmatrix} p1 \\ p2 \\ p3 \\ \vdots \\ pN \end{pmatrix} = \begin{pmatrix} c1, x1, y1, \theta 1, \phi 1 \\ c2, x2, y2, \theta 2, \phi 2 \\ c3, x3, y3, \theta 3, \phi 3 \\ \vdots \\ cN, xN, yN, \theta N, \phi N \end{pmatrix}$$

| Component name | (Component external appearance) | Component size (mm) | | | Two-dimensional recognition method | Pickup nozzle | Tact (sec) | Maximum speed level |
|---|---|---|---|---|---|---|---|---|
| | | X | Y | L | | | | |
| 0603CR | | 0.6 | 0.3 | 0.25 | Reflection | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | | | | |
| 6TR | | 4.3 | 4.5 | 1.5 | | | | |
| 1TIP | | 2.0 | φ1.0 | - | | Cylindrical chip | 0.11 | |
| 2TIP | | 3.6 | φ1.4 | - | | | | |
| 1CAP | | 3.8 | 1.9 | 1.6 | | S | | |
| 2CAP | | 4.7 | 2.6 | 2.1 | | | | |
| 3CAP | | 6.0 | 3.2 | 2.5 | | | | |
| 4CAP | | 7.3 | 4.3 | 2.8 | | M | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

FIG. 8

| Unit ID | Head information | Nozzle information | Cassette information | Tray information |
|---|---|---|---|---|
| 130a | 4-nozzle head | SX,SA,⋯ | 96 pieces | 8 stages |
| 130b | 8-nozzle head | None | 96 pieces | None |
| 132a | 8-nozzle head | S,M,⋯ | 48 pieces | None |

| Component type | Number of components |
|---|---|
| A | 6 |
| B | 7 |
| C | 8 |
| D | 9 |
| E | 2 |
| Total | 32 |

METHOD FOR COMPONENT MOUNTING

TECHNICAL FIELD

The present invention relates to a method for component mounting, and in particular to a method for component mounting used for a component mounter having a plurality of mounting heads which alternately mount components onto one board.

BACKGROUND ART

Conventionally, component mounters called alternate mounting component mounters are known which have two mounting heads alternately mounting components onto one board in the form of coordinated operation.

For determining component mounting conditions for such alternate mounting component mounters, it has been proposed to equalize the numbers of components to be mounted by two mounting heads (see, for example, Japanese Unexamined Patent Application Publication No. 2004-186391).

However, a problem arises in some cases where the conventional method for determining a component mounting condition is applied to an alternate mounting component mounter having mounting heads at positions facing each other with a board in between, that is, in front and rear of the board.

More specifically, although the conventional method for determining a component mounting condition is intended to equalize the numbers of components of the two mounting heads, the numbers of tasks of the two mounting heads are not always equalized. Here, the "task" refers to a set of operations including pickup, movement, and mounting of the components, which are repeatedly performed by line gang pickup heads (mounting heads). When the total number of tasks is an odd number, the tasks need to be allocated in such a manner that the number of tasks of either one of the two mounting heads is one greater than that of the other mounting head. However, as far as the conventional method of determining a component mounting condition is concerned, no technique has addressed which one of the mounting heads should be provided with more tasks. In addition, the size of the board is different depending on the component mounting board to be produced. Thus, the distance that the mounting head on the front side moves between a component supply unit and the board is not necessarily equal to the distance that the mounting head on the rear side moves between a component supply unit and the board. Accordingly, depending on how the tasks are allocated to the mounting heads, there may occur a case where a greater number of tasks are allocated to the mounting head which moves the longer distance between the component supply unit and the board. This causes a problem that the length of time for mounting components becomes long, since the total distance that the two mounting heads move becomes great.

SUMMARY OF INVENTION

The present invention has been conceived in order to solve the above-mentioned problem. An object of the present invention is to provide a method for component mounting for a so-called alternate mounting component mounter that minimizes the total distance that all mounting heads move, and achieves a reduction in the length of time for mounting components.

In order to achieve the above described object, the method for component mounting according to the present invention is a method for component mounting used for a component mounter including plural mounting heads which alternately mount components onto a board, the method including: specifying, as a first mounting head, one of the plural mounting heads which moves a shortest distance to the board; and mounting the components onto the board which is brought into the component mounter, the mounting starting from the first mounting head.

Since component mounting starts from the first mounting head, the number of times a second mounting head performs component mounting becomes equal to or one less than the number of times the first mounting head performs component mounting. Therefore, it is possible to reduce the total distance that the first and second mounting heads move to the board, and thus the total length of time that the first and second mounting heads take to move to the board can also be reduced. As a result, it is possible to reduce the length of time that the component mounter takes for mounting components.

Preferably, the specifying further includes specifying, as a second mounting head, an other one of the plural mounting heads which is different from the first mounting head, and the mounting includes: recognizing a board mark provided on the board so as to obtain an amount of correction of a component mounting position, the recognizing being performed by the second mounting head; and first mounting the components onto the board using the amount of correction after the recognizing, the first mounting starting from the first mounting head.

Otherwise, the mounting includes: recognizing a board mark provided on the board so as to obtain an amount of correction of a component mounting position, the recognizing being performed by the first mounting head; and first mounting the components onto the board using the amount of correction after the recognizing, the first mounting starting from the first mounting head.

More preferably, the specifying includes specifying, as a non-exchange mounting head, one of the plural mounting heads for which no exchange of pickup nozzles occurs when the components are mounted onto the board, the pickup nozzles being used for picking up the components supplied to the plural mounting heads, and the mounting further includes recognizing a board mark provided on a board to be produced after a first board, the recognizing being performed by the non-exchange mounting head.

Since the non-exchange mounting head performs the process of recognizing the board mark, it is possible to perform, in parallel, the process of recognizing the board and the process of exchanging nozzles. In addition, the process of mounting the components can immediately start after the process of recognizing the board mark finishes. As a result, the length of time that the component mounter takes for mounting the components can be reduced.

Here, in addition to implementation of the present invention as a method for component mounting provided with such characteristic steps, the present invention may also be implemented: as a method for determining a component mounting condition used in the method for component mounting; as a component mounting condition determining apparatus having, as means, the characteristic steps included in the method for determining a component mounting condition; and as a program that causes a computer to execute the characteristic steps included in the method for determining a component mounting condition. In addition, it goes without saying that such a program may be distributed via a recording medium such as a Compact Disc-Read Only Memory (CD-ROM) and a communication network such as the Internet.

According to the present invention, it is possible to provide a method for component mounting for a so-called alternate mounting component mounter which minimizes the total distance that all mounting heads move and achieves a reduction in a length of time for mounting components.

FURTHER INFORMATION ABOUT TECHNICAL BACKGROUND TO THIS APPLICATION

The disclosure of Japanese Patent Application No. 2006-304389 filed on Nov. 9, 2006 including specification, drawings and claims is incorporated herein by reference in its entirety.

BRIEF DESCRIPTION OF DRAWINGS

FIG. 6 is a diagram showing an example of mounting point data.

FIG. 8 is a diagram showing an example of mounting apparatus information.

FIG. 9 is a diagram showing an example of mounting point information.

DETAILED DESCRIPTION OF THE INVENTION

First Embodiment

Hereinafter, a component mounting system according to a first embodiment of the present invention shall be described.

Figure 1:
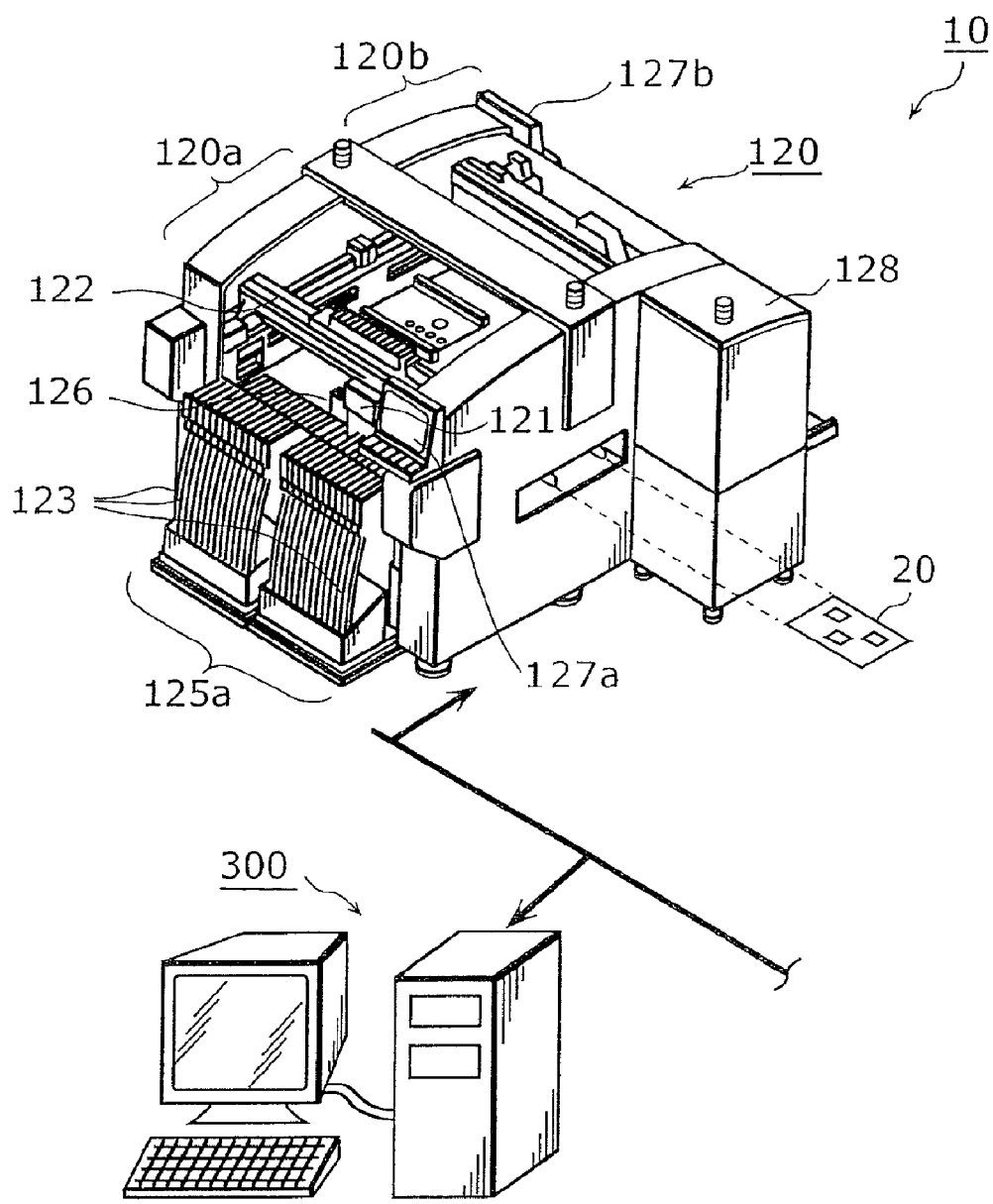
FIG. 1 is a diagram showing a configuration of a component mounting system according to a first embodiment of the present invention.

FIG. 1 is a diagram showing a configuration of a component mounting system according to the first embodiment of the present invention.

A component mounting system 10 is a system for mounting components onto a board so as to produce a circuit board, and includes a component mounter 120 and a component mounting condition determining apparatus 300.

The component mounter 120 is an apparatus for mounting electronic components while transferring the circuit board from the upstream to the downstream, and includes two sub-equipment (a front sub-equipment 120a and a rear sub-equipment 120b) for performing component mounting in the form of cooperated alternate operation.

The front sub-equipment 120a includes: a component supply unit 125a which includes an array of component cassettes 123 each storing a component tape; a line gang pickup head 121 having a plurality of pickup nozzles (hereinafter simply referred to as "nozzles" in some cases) capable of picking up electronic components from the component cassettes 123 and mounting them onto a board 20; a beam 122 to which the line gang pickup head 121 is attached; and a component recognizing camera 126 for inspecting in a two-dimensional or three-dimensional manner the pickup state of components picked up by the line gang pickup head 121.

The line gang pickup head 121 is equipped with a camera for recognizing a board mark which is to be described later.

The rear sub-equipment 120b also has a configuration similar to that of the front sub-equipment 120a. Here, the rear sub-equipment 120b has a tray supply unit 128 which supplies tray components. However, the tray supply unit 128 and the like are not provided in some cases depending on the sub-equipment.

Here, the "component tape" indicates a tape (carrier tape) on which a plurality of components of the same component type are arranged. This tape is supplied in a form that it is wound around a reel (supply reel) or the like, and is mainly used for supplying, to a component mounter, components which are in a relatively small size and are referred to as chip components.

Specifically, the component mounter 120 is a mounting apparatus that has both the function of a component mounter referred to as a high-speed mounter and the function of a component mounter referred to as a multifunctional mounter. The high-speed mounter is an apparatus that generally, is characterized by high productivity and mounts electronic components of 10 mm square or smaller at a speed of the order of 0.1 second each. The multifunctional mounter is an apparatus that mounts large-size electronic components of 10 mm square or larger, irregularly shaped components such as switches and connectors, and Integrated Circuit (IC) components such as a Quad Flat Package (QFP) and a Ball Grid Array (BGA).

In other words, the component mounter 120 is designed to be capable of mounting almost all types of electronic components (the range of components to be mounted extends from a 0.4-mm×0.2-mm chip resistor to a 200-mm connector). Thus, by simply arranging a necessary number of the component mounters 120, a mounting line can be constructed.

Figure 2:
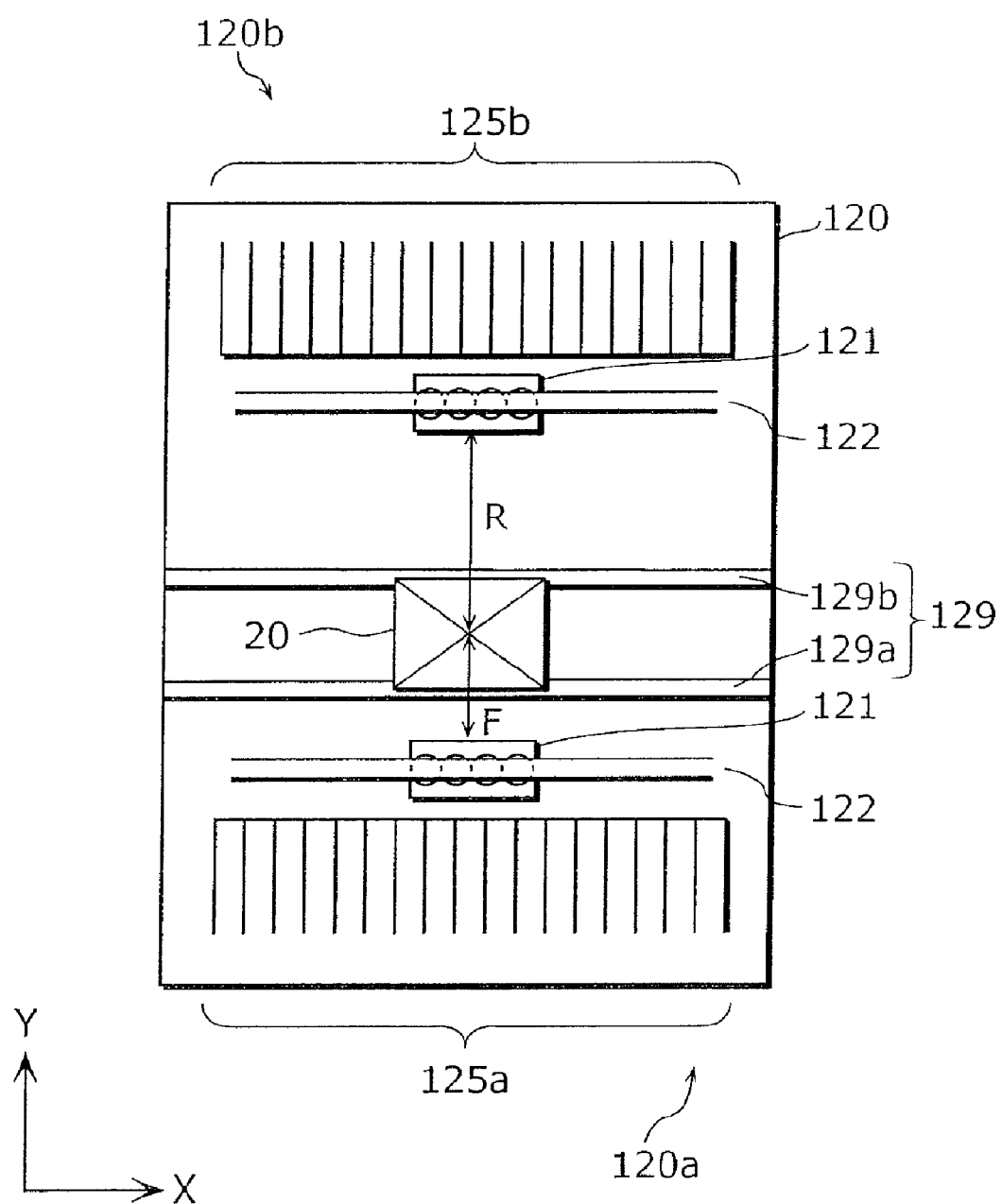
FIG. 2 is a plan view of a component mounter showing a major inner configuration thereof.

FIG. 2 is a plan view of the component mounter 120 showing a major inner configuration thereof.

In the component mounter 120, the respective front sub-equipment 120a and the rear sub-equipment 120b are provided in the forward and backward directions (Y-axis direction) of the component mounter 120 which are perpendicular to the transportation direction (X-axis direction) of the board 20. The component mounter taken as an example in the present and following embodiments is a component mounter which has a line gang pickup head 121 on the front side and another line gang pickup head 121 on the rear side as there are the front sub-equipment 120a and the rear sub-equipment 120b. Note, however, that a component mounter to which the present invention is applied is not limited to this example. For example, the component mounter may have a line gang pickup head 121 on the upstream side and another line gang pickup head 121 on the downstream side in the direction of transporting the board 20, and these line gang pickup heads 121 may alternately mount components on to the board 20. Therefore, the present invention can be applied to any component mounter, irrespective of how line gang pickup heads 121 are arranged, as long as the component mounter has plural line gang pickup heads 121 each of which moves a different distance between a component supply unit and the board 20.

The front sub-equipment 120a and the rear sub-equipment 120b cooperate with each other so as to perform mounting work on one board 20.

The front sub-equipment 120a and the rear sub-equipment 120b are provided with a component supply unit 125a and a component supply unit 125b, respectively. Further, each of the front sub-equipment 120a and the rear sub-equipment 120b is provided with a beam 122 and a line gang pickup head 121. Furthermore, in the component mounter 120, a pair of rails 129 for transporting the board 20 is provided between the front sub-equipment and the rear sub-equipment.

The rails 129 include a fixed rail 129a and a movable rail 129b. The position of the fixed rail 129a is fixed in advance, whereas the movable rail 129b can be moved in the Y-axis direction in accordance with the length of the transported board 20 in the Y-axis direction.

Note that the component recognizing camera 126, the tray supply unit 128 and the like are omitted in the figure, since they are not essential parts of the present invention.

The beam 122 is a rigid body extending in the X-axis direction (the transportation direction of the board 20), and can move on a railway (not shown) provided in the Y-axis direction (perpendicular to the transportation direction of the board 20), while being parallel to the X-axis direction. Further, the beam 122 allows the line gang pickup head 121 attached to the beam 122 to move along the beam 122, that is, to move in the X-axis direction. Thus, by virtue of the movement of the beam 122 in the Y-axis direction and the X-axis directional movement of the line gang pickup head 121 that moves in the Y-axis direction in association with the movement of the beam 122, the line gang pickup head 121 can move freely in the XY plane. Further, a plurality of motors such as motors (not shown) for driving these are provided in the beam 122. Electric power to these motors and the like is supplied via the beam 122.

Figure 3:
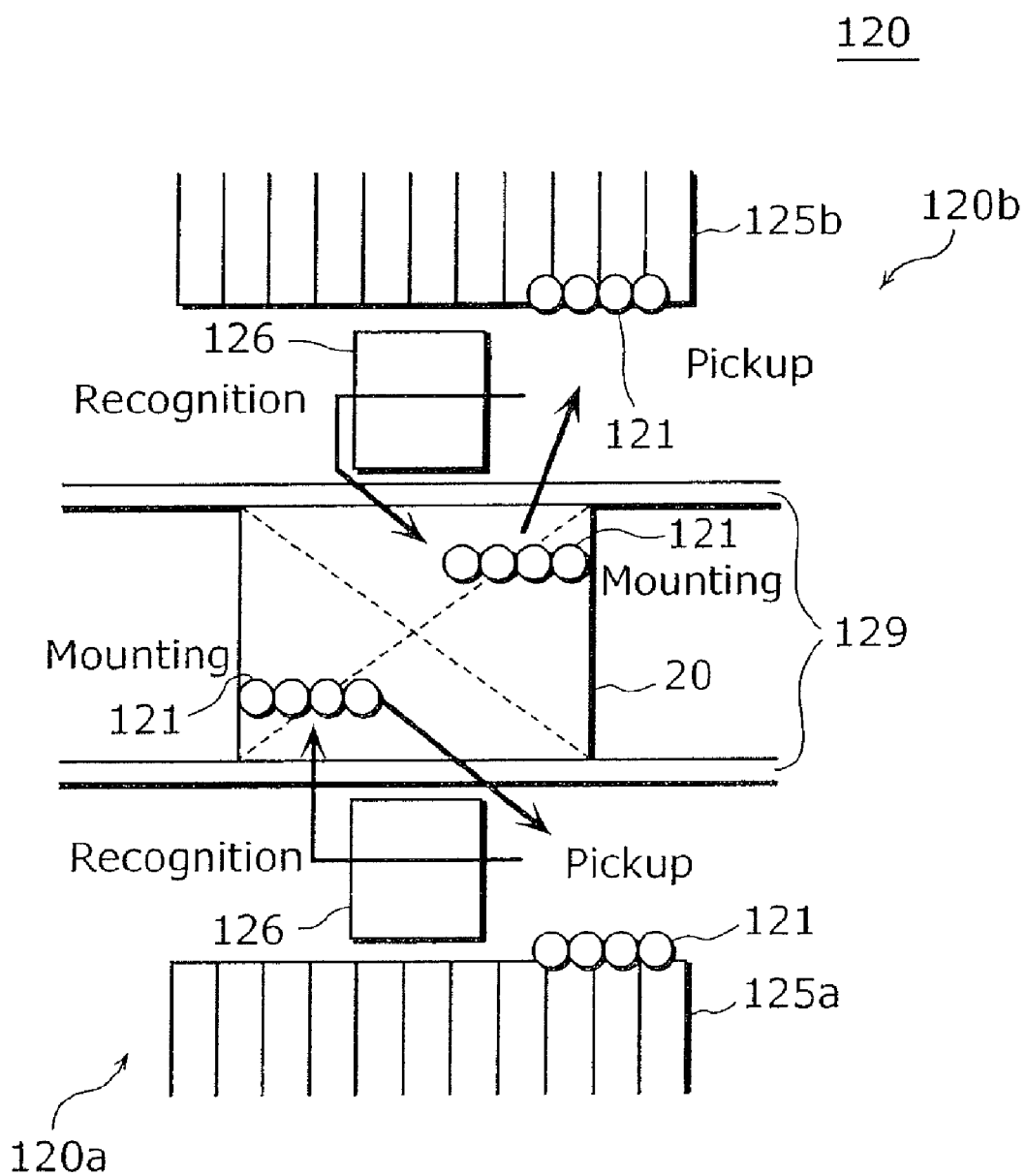
FIG. 3 is a diagram illustrating component mounting performed by a component mounter.
Figure 4:
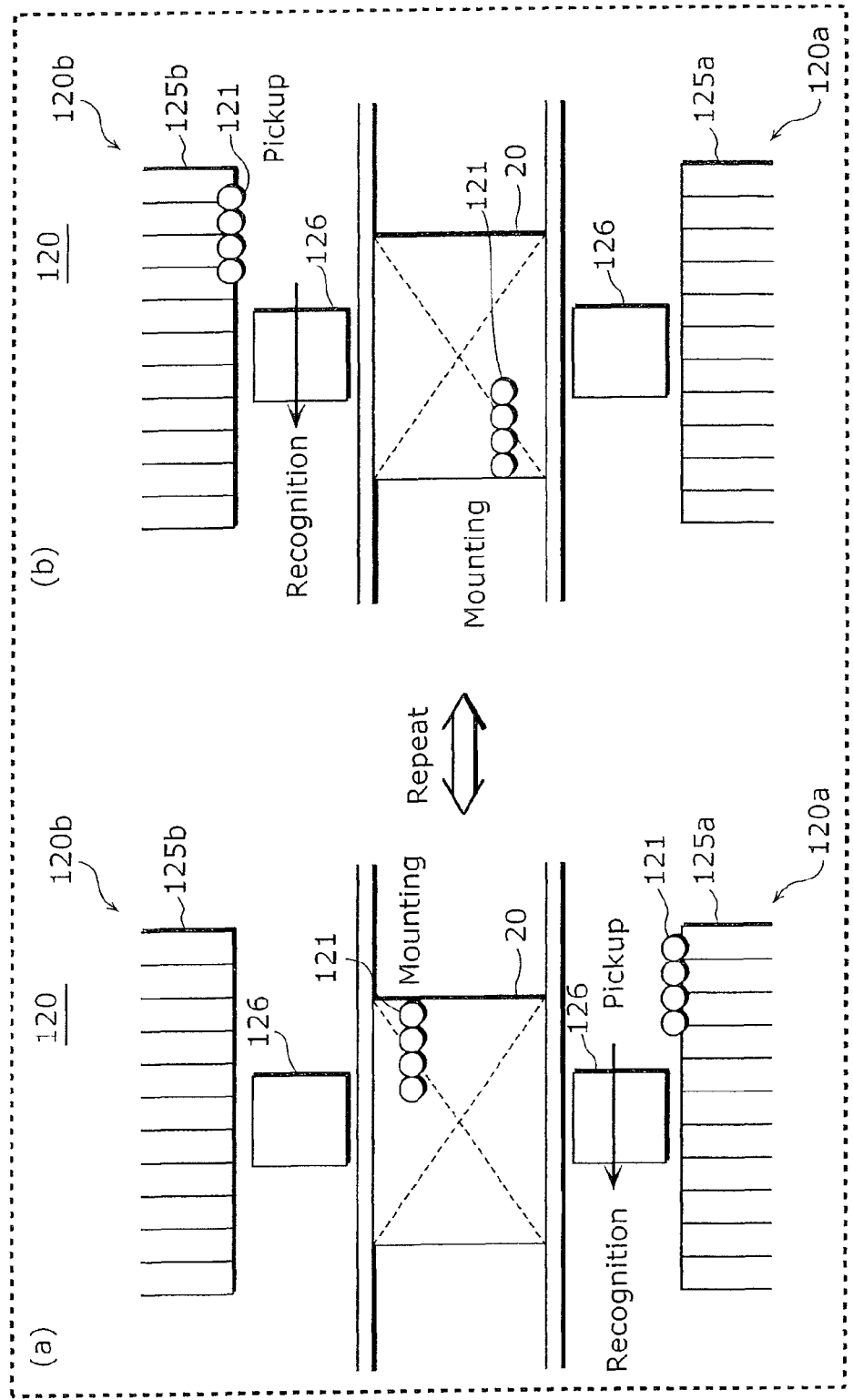
FIG. 4 is a diagram illustrating component mounting performed by a component mounter.

FIGS. 3 and 4 are diagrams illustrating component mounting performed by the component mounter 120.

As shown in FIG. 3, the line gang pickup head 121 of the rear sub-equipment 120b mounts the components onto the board 20 by repeating three kinds of operations including "pickup" of the components from the component supply unit 125b, "recognition" of the picked-up components using the component recognizing camera 126, and "mounting" of the recognized components onto the board 20.

Note that the line gang pickup head 121 of the front sub-equipment 120a similarly mounts the components onto the board 20 by alternately repeating the three kinds of operations, that is, "pickup", "recognition" and "mounting".

Note that when the two line gang pickup heads 121 simultaneously perform "mounting" of the components, the line gang pickup heads 121 mount the components onto the board 20 in the form of coordinated operation in order to avoid collision with each other. More specifically, as shown in FIG. 4(a), while the line gang pickup head 121 of the rear sub-equipment 120b is performing the "mounting" operation, the line gang pickup head 121 of the front sub-equipment 120a performs the "pickup" operation and the "recognition" operation. In contrast, as shown in FIG. 4(b), while the line gang pickup head 121 of the front sub-equipment 120a is performing the "mounting" operation, the line gang pickup head 121 of the rear sub-equipment 120b performs the "pickup" operation and the "recognition" operation. As described, since the two line gang pickup heads 121 alternately perform the "mounting" operation, collision between the line gang pickup heads 121 can be avoided. Here, in an ideal case, if one of the line gang pickup heads 121 completes the "pickup" operation and the "recognition" operation during the time that the other line gang pickup head 121 performs the "mounting" operation, the one of the line gang pickup heads 121 can start the "mounting" operation without delay at the time that the other line gang pickup head 121 completes the "mounting" operation. This improves production efficiency.

Figure 5:
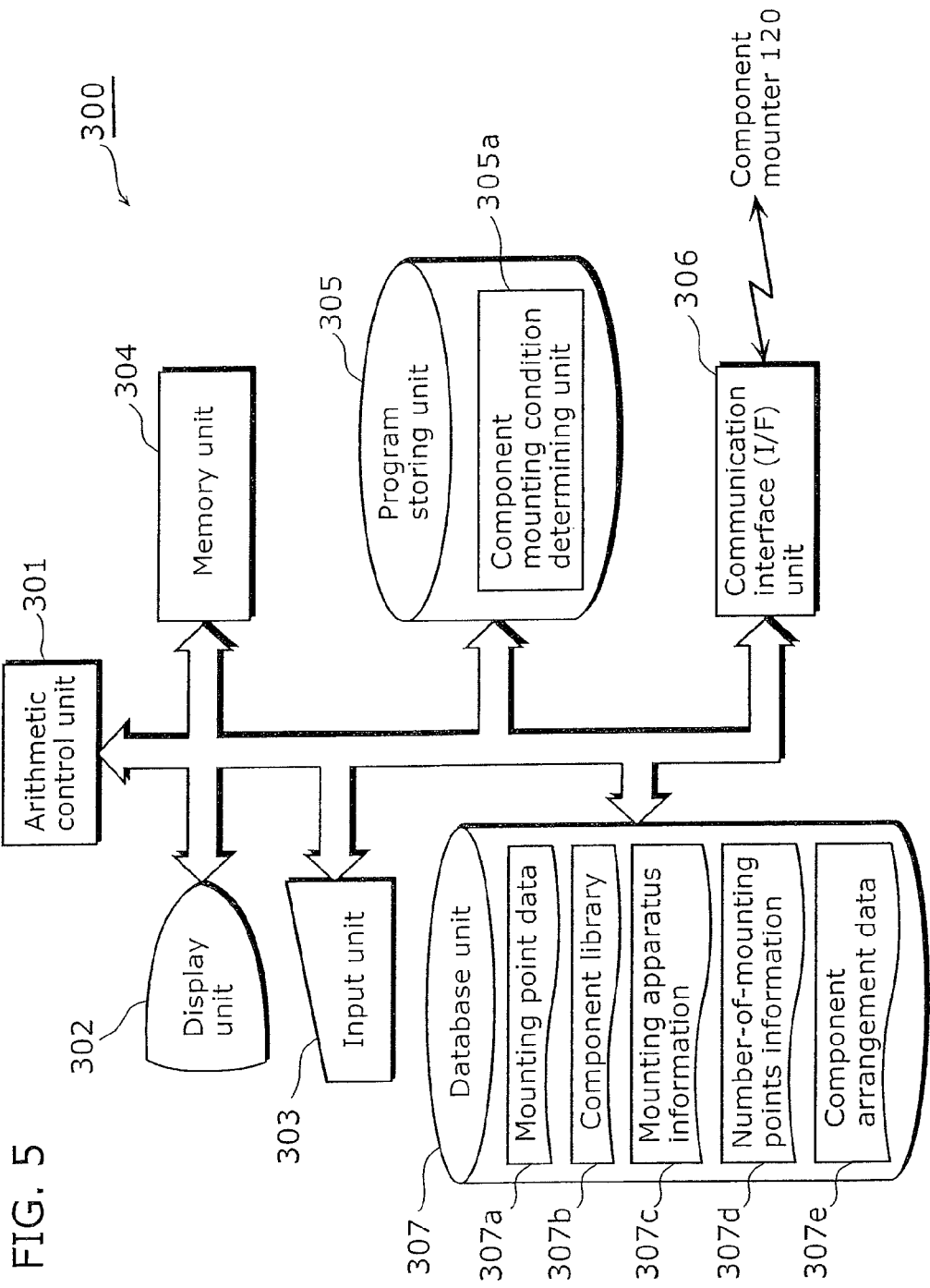
FIG. 5 is a block diagram showing a functional configuration of a component mounting condition determining apparatus.

FIG. 5 is a block diagram showing a functional configuration of the component mounting condition determining apparatus 300.

The component mounting condition determining apparatus 300 is a computer for performing processing for each component mounter such as determining an order of mounting components onto the board 20 and determining positions for supplying components to each component mounter. The component mounting condition determining apparatus 300 includes an arithmetic control unit 301, a display unit 302, an input unit 303, a memory unit 304, a program storing unit 305, a communication interface (I/F) unit 306, a database unit 307, and the like. As described below, the component mounting condition determining apparatus 300 determines a component mounting condition such that the lengths of time for mounting components are reduced for the line gang pickup head 121 of the front sub-equipment 120a and the line gang pickup head 121 of the rear sub-equipment 120b.

The component mounting condition determining apparatus 300 is implemented by a general-purpose computer system such as a personal computer by executing a program according to the present invention. When the component mounter 120 is not connected, the component mounting condition determining apparatus 300 also serves as a stand-alone simulator (a tool for determining a component mounting condition). Note that the function of the component mounting condition determining apparatus 300 may be installed in the component mounter 120.

The arithmetic control unit 301 is a Central Processing Unit (CPU), a numerical processor and the like. In response to an instruction or the like from the operator, the arithmetic control unit 301 loads a necessary program from the program storing unit 305 to the memory unit 304, and executes it. Then, in accordance with the execution result, the arithmetic control unit 301 controls each of the constituent elements 302 to 307.

The display unit 302 is a Cathode-Ray Tube (CRT), a Liquid Crystal Display (LCD) or the like, while the input unit 303 is a keyboard, a mouse and the like. These units are used for interactive operations or the like between the component mounting condition determining apparatus 300 and the operator, under the control of the arithmetic control unit 301.

The communication I/F unit 306 is a Local Area Network (LAN) adapter or the like, and is used for communication and the like between the component mounting condition determining apparatus 300 and the component mounter 120, for example. The memory unit 304 is a Random Access Memory (RAM) or the like that provides a working area for the arithmetic control unit 301.

The database unit 307 is a hard disk or the like that stores, for example: input data (such as mounting point data 307a, a component library 307b, mounting apparatus information 307c, and number-of-mounting-points information 307d) used for processing of determining a component mounting condition performed by the component mounting condition determining apparatus 300; and component arrangement data 307e that is generated as a result of processing performed by the component mounting condition determining apparatus 300 and that indicates the component arrangement in the component supply unit.

FIGS. 6 to 9 are diagrams respectively showing examples of the mounting point data 307a, the component library 307b, the mounting apparatus information 307c and the number-of-mounting-points information 307d.

The mounting point data 307a is a group of information that indicates mounting points for all components to be mounted. As shown in FIG. 6, one mounting point pi includes a component type ci, an X-coordinate xi, a Y-coordinate yi, a mounting angle θi, and control data φi. Here, the "component type" corresponds to the component name in the component library 307b shown in FIG. 7. The "X-coordinate" and the "Y-coordinate" are the coordinates of the mounting point (coordinates that indicate a particular position on the board). The "mounting angle" is a rotation angle of a component when being mounted onto the board. The "control data" is constraint information concerning the mounting of the component (such as the type of a usable pickup nozzle and the maximum moving speed of the line gang pickup head 121). Note that Numeric Control (NC) data to be eventually acquired is a sequence of mounting points that minimizes a line tact.

Figure 7:
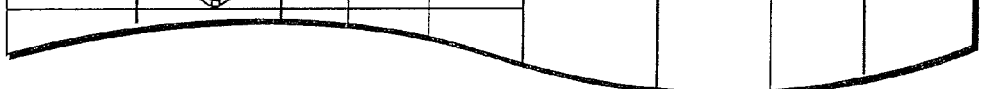
FIG. 7 is a diagram showing an example of a component library.

The component library 307b is a collection of information unique to each type of components that can be processed by the component mounter 120 and the like. As shown in FIG. 7, the component library 307b contains for each component type: a component size; a tact (the tact unique to the component type under a particular condition); and other constraint information (such as the type of a usable pickup nozzle, the recognition method used by the component recognizing camera 126, and the maximum speed level of the line gang pickup head 121). Here, in the figure, external views of components of various types are also shown as reference.

The mounting apparatus information 307c is information that indicates the apparatus configuration, the above-mentioned constraints, and the like for all individual sub-equipment that make up the production line. As shown in FIG. 8, the mounting apparatus information 307c includes: head information concerning the type of the line gang pickup heads 121, that is, concerning, for example, the number of pickup nozzles provided in the line gang pickup heads 121; nozzle information concerning, for example, the type of the pickup nozzles that can be attached to the line gang pickup heads 121; cassette information concerning, for example, the maximum number of component cassettes 123; and tray information concerning, for example, the number of trays held in the tray supply unit 128.

The number-of-mounting-points information 307d is information in which correspondence is established between component types of mounting points to be mounted onto the board 20 and their numbers (the number of mounting points for each component). As shown in FIG. 9, the types of components mounted by the component mounter 120 include five types, namely, A, B, C, D and E, and the numbers of mounting points are 6, 7, 8, 9 and 2, respectively.

The program storing unit 305 shown in FIG. 5 is a hard disk and the like for storing various programs for implementing the function of the component mounting condition determining apparatus 300. The programs determine a component mounting condition for the component counter 120, and include the component mounting condition determining unit 305a and the like in terms of the function (as a processing unit that performs the function when executed by the arithmetic control unit 301).

The component mounting condition determining unit 305a determines a component mounting condition such that the length of time for mounting components is minimized.

The following is a description of a method of determining a component mounting condition for the component mounting condition determining unit 305a.

Figure 10:
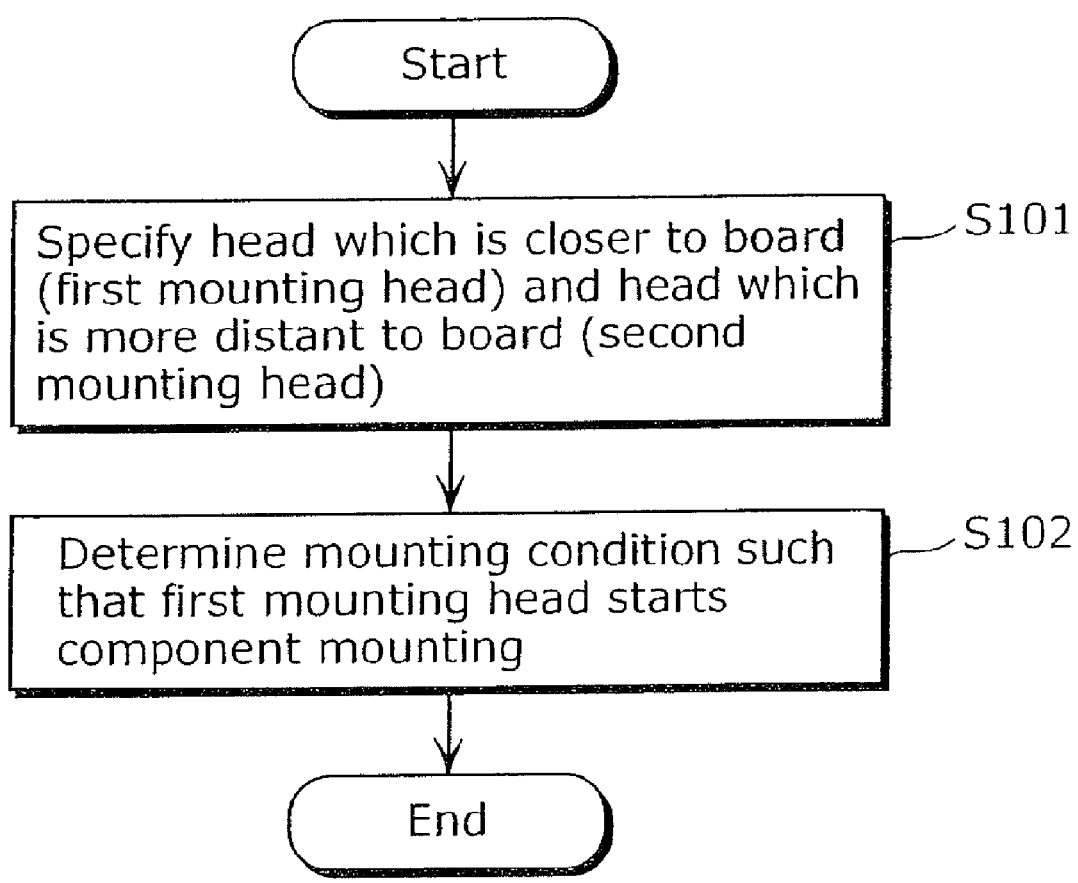
FIG. 10 is a flowchart of processing performed by a component mounting condition determining unit.

FIG. 10 is a flowchart of processing performed by the component mounting condition determining unit 305a.

From among the line gang pickup head 121 of the front sub-equipment 120a and the line gang pickup head 121 of the rear sub-equipment 120b, the component mounting condition determining unit 305a specifies, as a first mounting head, a line gang pickup head which moves a shorter distance in the Y-axis direction between a component supply unit and the board 20, and specifies, as a second mounting head, a line gang pickup head which moves a longer distance in the Y-axis direction between a component supply unit and the board 20 (S101). As shown in FIG. 2, the component mounter 120 is provided with the fixed rail 129a on the front sub-equipment 120a-side and the movable rail 129b on the rear sub-equipment 120b-side. Therefore, the line gang pickup head 121 on the front sub-equipment 120a-side is specified as the first mounting head, and the line gang pickup head 121 on the rear sub-equipment 120b-side is specified as the second mounting head. Note that the line gang pickup head 121 on the front sub-equipment 120a-side is specified as the first mounting head because the distance relationship between F and R in FIG. 2 is F<R. Here, F refers to a distance that the line gang pickup head 121 of the front sub-equipment 120a moves between the component supply unit 125a and the center of the board 20. Likewise, R refers to a distance that the line gang pickup head 121 of the rear sub-equipment 120b moves between the to component supply unit 125b and the center of the board 20.

However, the line gang pickup head 121 on the sub-equipment-side where the fixed rail 129a is provided is not always the first mounting head. For example, in the case where the board 20 which is long in the Y-axis direction is brought in FIG. 2, the movable rail 129b moves towards the rear side (the upper side of the figure) in order to accommodate the board 20. As a result, there is a case where the relationship between the distance R and the distance F is R<F. In such a case, the line gang pickup head 121 of the rear sub-equipment 120b is specified as a first mounting head.

Now, a method for obtaining the distances F and R shall be described.

For example, the component mounting condition determining unit 305a may calculate the distances F and R based on data that indicates the size of the board 20. Also, the component mounting condition determining unit 305a may detect the position of the movable rail 129b in the Y-axis direction so as to calculate the distances F and R based on the detected position.

Note that the movable rail 129b may be provided on the front sub-equipment 120a-side and the fixed rail 129a may be provided on the rear sub-equipment 120b-side. In either case, the component mounting condition determining unit 305a calculates the distances F and R that the line gang pickup heads 121 move, and specifies the line gang pickup head 121 that moves a shorter distance as a first mounting head.

Although the distances F and R in the above description refer to the distances to the center of the board 20, the distances F and R are not limited to this. For example, a distribution of all the mounting points of components to be mounted on the board 20 by each of the line gang pickup heads 121 may be taken into consideration, and the distances F and R may be distances to the center of the distribution.

The component mounting condition determining unit 305a determines a component mounting condition such that component mounting starts from the first mounting head (S102).

By determining such a component mounting condition for component mounting to start from the first mounting head, it is possible to prevent the number of tasks of the second mounting head from being high.

Figure 11:
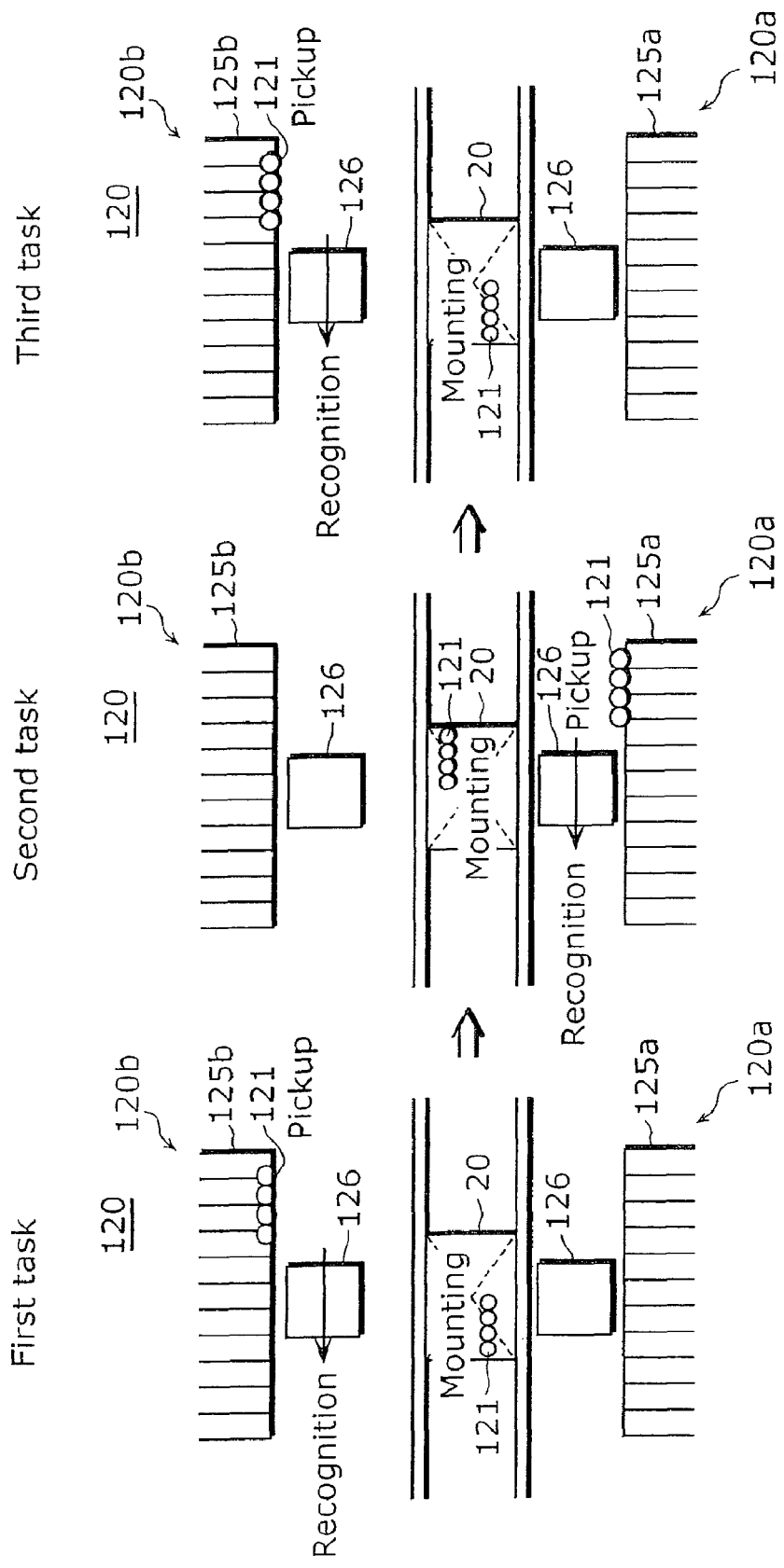
FIG. 11 is a diagram illustrating a mounting order in the case where the number of tasks is an odd number.

More specifically, in the case where the total number of tasks of the mounting heads is an even number, the number of tasks of the first mounting head becomes equal to the number of tasks of the second mounting head. However, in the case where the total number of tasks of the mounting heads is an odd number as shown in FIG. 11, the number of tasks of the second mounting head can be arranged to be less than the number of tasks of the first mounting head. By doing so, it is possible to prevent the number of tasks of the second mounting head from being higher than the number of tasks of the first mounting head.

Figure 12:
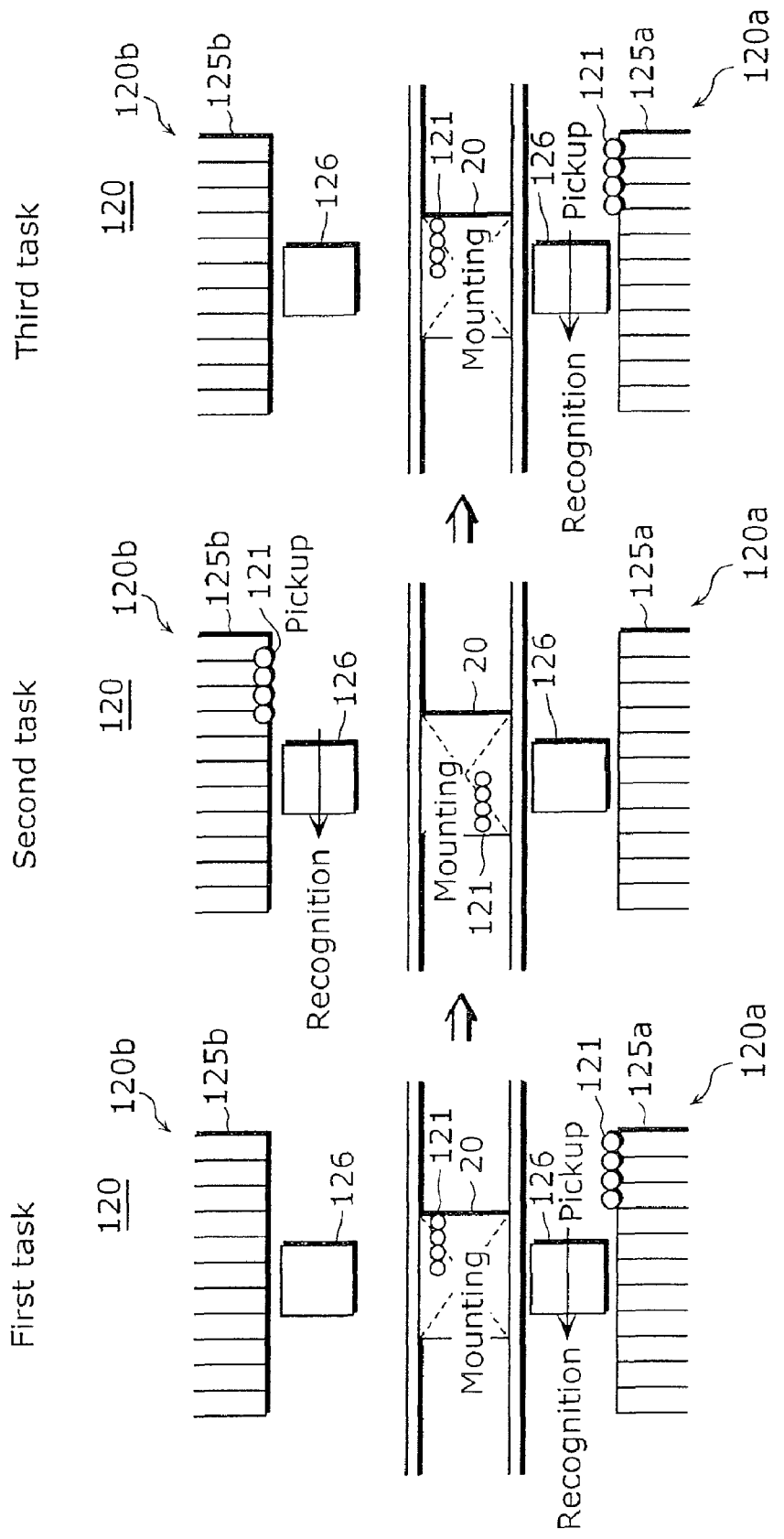
FIG. 12 is a diagram illustrating an undesirable mounting order in the case where the number of tasks is an odd number.

Suppose component mounting starts from the second mounting head in the case where the total number of tasks is an odd number as shown in FIG. 12. In such a case, the number of times that the second mounting head moves between the component supply unit and the board becomes higher than the number of times that the first mounting head moves between the component supply unit and the board 20. For this reason, compared to the case shown in FIG. 11, the total distance that the first mounting head and the second mounting head move between the component supply units and the board 20 becomes long. As a result, the length of time that the component mounter 120 takes for mounting components also becomes long.

According to the component mounting condition determined by the component mounting condition determining unit 305a, the number of tasks of the second mounting head which moves a longer distance to the board 20 is smaller, and therefore it is possible to reduce the total distance that the first mounting head and the second mounting head move to the board 20. As a result, the length of time that the component mounter 120 takes for mounting components can be reduced.

In FIG. 11, the distance relationship between the distance R and the distance F in FIG. 2 is assumed to be R>F. Note, however, that in the case where the relationship is R<F, the line gang pickup head 121 of the rear sub-equipment 120b is specified as a first mounting head, and thus component mounting starts from the line gang pickup head 121 of the rear sub-equipment 120b.

Second Embodiment

Next, a component mounting system according to a second embodiment of the present invention shall be described. In the second embodiment, an operation of mounting components performed in accordance with the mounting condition determined in the first embodiment shall be described in detail based on FIGS. 13 and 14. Moreover, in the second embodiment, recognition of a board mark provided on the board shall be described using a case example where the second mounting head performs the recognition.

The configuration of the component mounting system is the same as the configuration shown in the first embodiment. Thus, the detailed description thereof is not repeated here.

Figure 13:
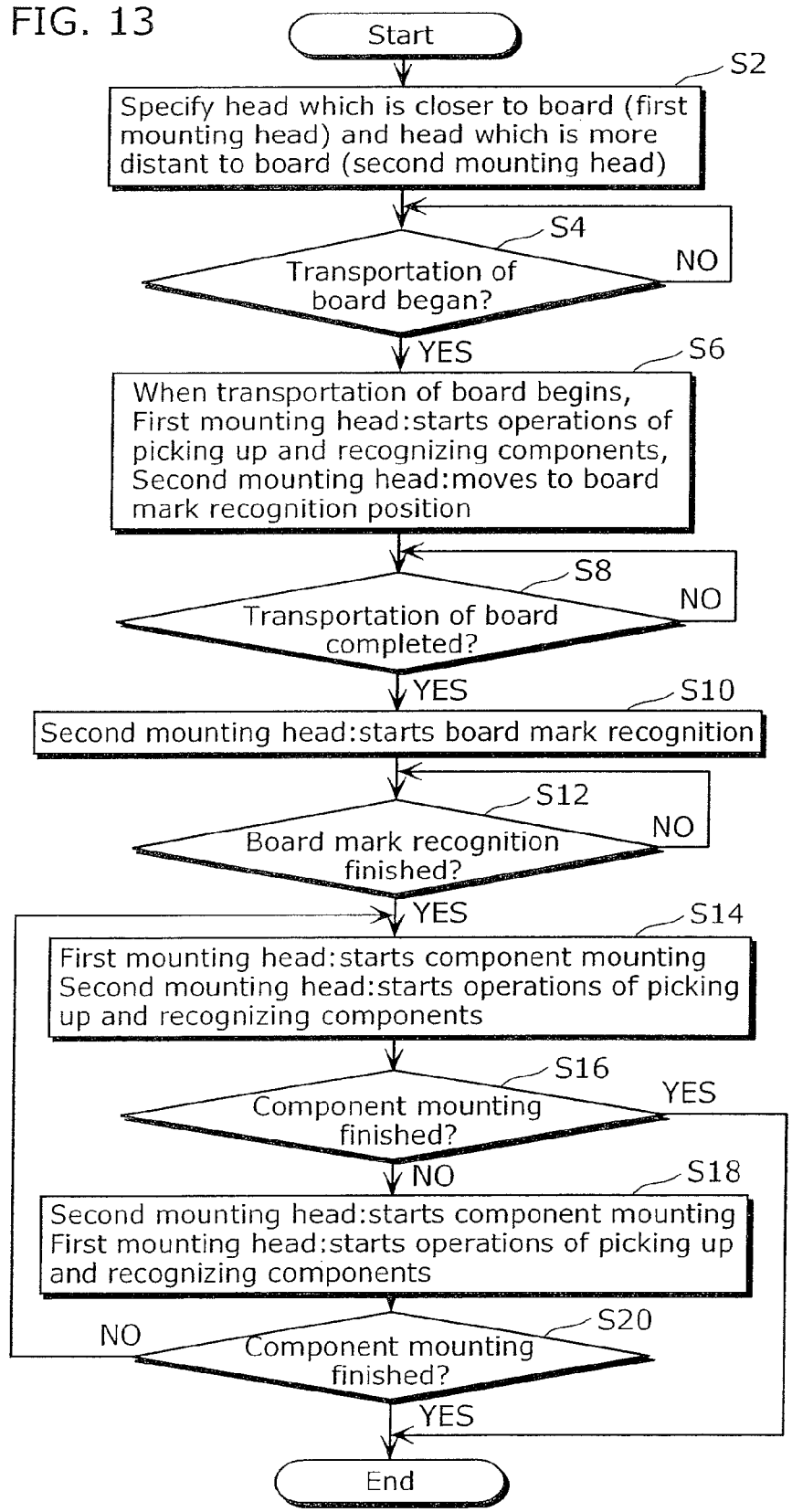
FIG. 13 is a flowchart of a component mounting process performed by a component mounter in accordance with a component mounting condition determined by a component mounting condition determining unit of a component mounting condition determining apparatus.
Figure 14:
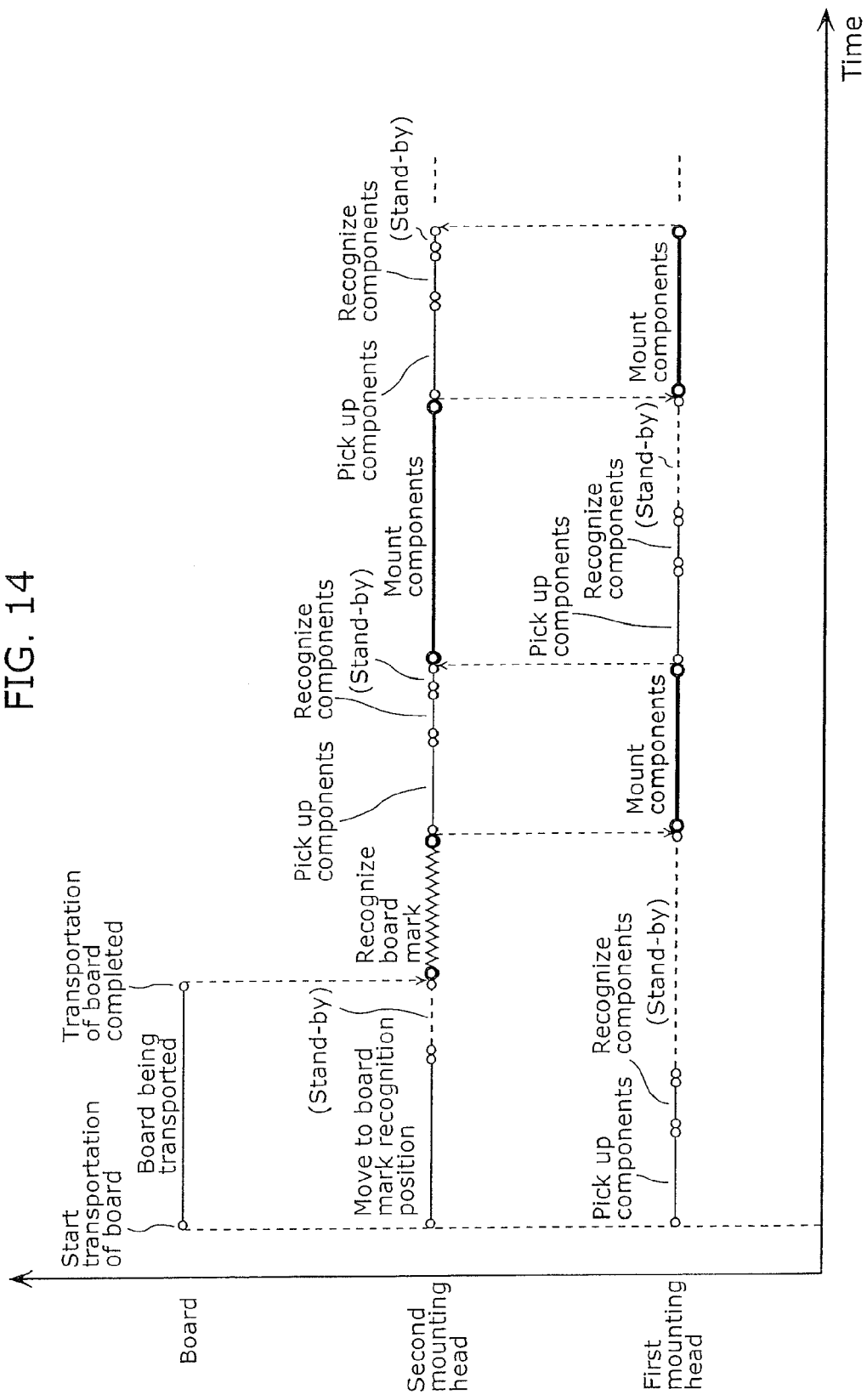
FIG. 14 is a timing chart of a component mounting process performed by a first mounting head and a second mounting head of a component mounter.

FIG. 13 is a flowchart of a component mounting process performed by the component mounter 120 in accordance with a component mounting condition determined by the component mounting condition determining unit 305a of the component mounting condition determining apparatus 300. FIG. 14 is a timing chart of a component mounting process performed by after-mentioned first mounting head and second mounting head of the component mounter 120.

First, from among the line gang pickup head 121 of the front sub-equipment 120a and the line gang pickup head 121 of the rear sub-equipment 120b, a line gang pickup head which moves a shorter distance to the board 20 in the Y-axis direction is specified as a first mounting head, and a line gang pickup head which moves a longer distance to the board 20 in the Y-axis direction is specified as a second mounting head (S2). As shown in FIG. 2, the component mounter 120 is provided with the fixed rail 129a on the front sub-equipment 120a-side and the movable rail 129b on the rear sub-equipment 120b-side. Therefore, the line gang pickup head 121 on the front sub-equipment 120a-side is specified as the first mounting head, and the line gang pickup head 121 on the rear sub-equipment 120b-side is specified as the second mounting head. Note that the line gang pickup head 121 on the front sub-equipment 120a-side is specified as the first mounting head because the distance relationship between F and R in FIG. 2 is F<R. In the case where the board 20 which is long in the Y-axis direction is brought into the component mounter 120, the distance relationship may be R<F. In such a case, the line gang pickup head 121 of the rear sub-equipment 120b is specified as a first mounting head.

Figure 15:
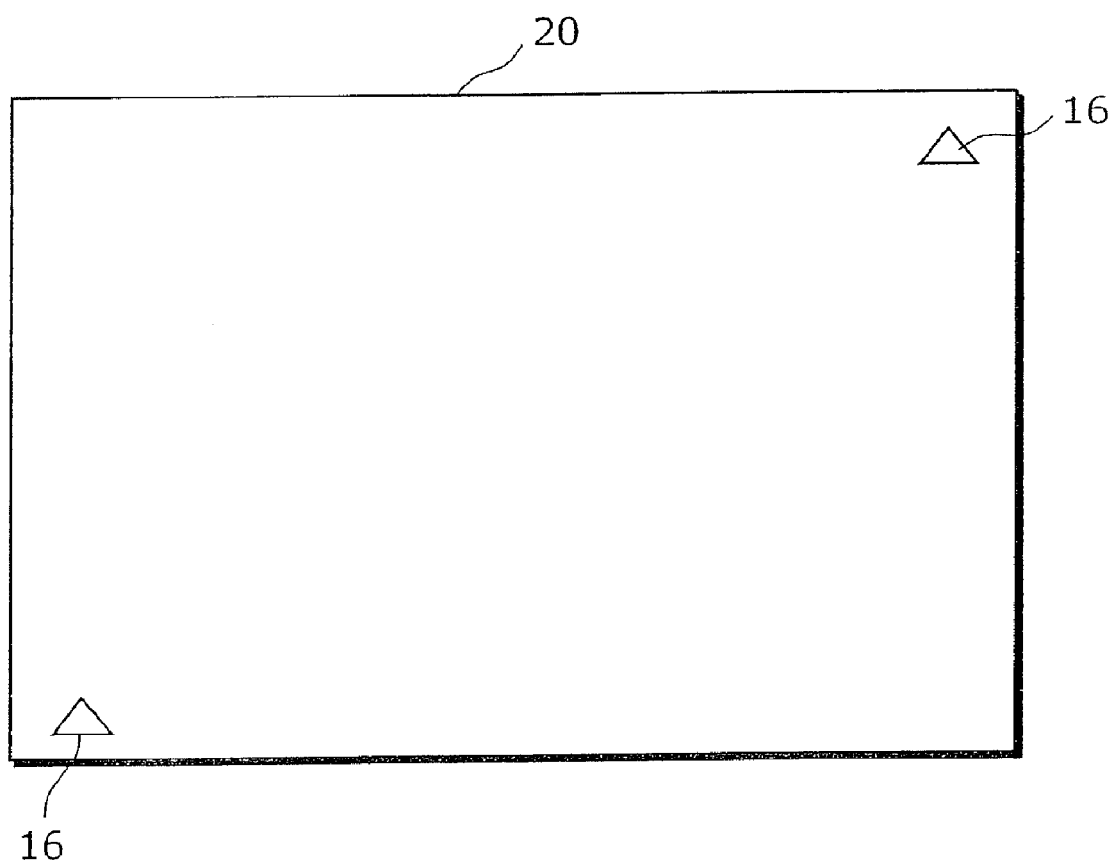
FIG. 15 is a diagram illustrating board marks provided on a board.

When transportation of the board 20 to the component mounter 120 begins (Yes in S4), the first mounting head starts the process of picking up components and the process of recognizing the components, and the second mounting head moves to a predetermined position near a board mark provided on the board 20 (S6). Note that the second mounting head may move to a recognition position of the board mark. As shown in FIG. 15, board marks 16 are provided in corners of the board 20.

When the transportation of the board 20 to the component mounter 120 completes (Yes in S8), the second mounting head starts the recognition of the board marks 16 (S10). By performing image recognition of the board marks 16, it is possible to obtain an amount of shift of the board 20 in the planar direction, an amount of shift in the rotation of the board 20, and an amount of correction such as an amount of expansion and contraction of the board 20. The amount of correction obtained by the recognition of the board marks 16 performed by the second mounting head is used for correcting the component mounting position when the first and second mounting heads mount components.

When the second mounting head finishes the process of recognizing the board marks 16 (Yes in S12), the first mounting head starts the process of component mounting and the second mounting head starts the process of picking up components and the process of recognizing the components (S14).

When the first mounting head finishes the process of component mounting, it is judged whether or not all the components have been mounted onto the board 20 (S16). In the case where a judging result shows that all the components have been mounted onto the board 20 (Yes in S16), the process ends.

In the case where a judging result shows that all the components have not been mounted (No in S16), the second mounting head starts the process of component mounting, and the first mounting head starts the process of picking up components and the process of recognizing the components (S18).

When the second mounting head finishes the process of component mounting, it is judged whether or not all the components have been mounted onto the board 20 (S20). In the case where a judging result shows that all the components have been mounted onto the board 20 (Yes in S20), the process ends.

In the case where a judging result shows that all the components have not been mounted (No in S20), the processes from S14 onwards are repeated.

As described above, according to the second embodiment, a component mounting condition is determined such that mounting in a first task (the task to be performed earlier) is performed by the first mounting head which moves a shorter distance to the board 20 in the Y-axis direction.

As a result, the number of times the second mounting head performs component mounting becomes equal to or one less than the number of times the first mounting head performs component mounting. Therefore, it is possible to reduce the total distance that the first and second mounting heads move to the board 20, and thus the total length of time that the first and second mounting heads take to move to the board 20 can also be reduced. As a result, the length of time that the component mounter 120 takes for mounting components can be reduced.

For example, in the case where the number of tasks is an odd number as shown in FIG. 11, the number of tasks of the second mounting head (the number of times that components are mounted) becomes one less than the number of tasks of the first mounting head. As described, since the number of tasks of the second mounting head which moves a longer distance to the board 20 is smaller than that of the first mounting head, it is possible to reduce the total length of time that the first and second mounting heads take to move to the board 20. As a result, the length of time that the component mounter 120 takes for mounting components can be reduced.

When transportation of the board 20 begins, the second mounting head moves to a predetermined position near a board mark. Consequently, when the transportation of the board 20 completes, the second mounting head can immediately perform the process of recognizing the board mark. As a result, the length of time that the component mounter 120 takes for mounting components can be reduced.

Further, the first mounting head performs the process of picking up components and the process of recognizing the components while the board is being transported. Consequently, when the process of recognizing the board mark finishes, the first mounting head can immediately start the process of component mounting. As a result, the length of time that the component mounter 120 takes for mounting components can be reduced.

Third Embodiment

Next, a component mounting system according to a third embodiment of the present invention shall be described. In the third embodiment, an operation of mounting components performed in accordance with the mounting condition determined in the first embodiment shall be described in detail based on FIGS. 16 and 17. Moreover, in the third embodiment, recognition of a board mark provided on the board shall be described using a case example where the first mounting head performs the recognition.

In the component mounting system according to the third embodiments, as in the systems in the first and second embodiments, the component mounting starts from the first mounting head which moves the shorter distance to the board. However, the component mounting system according to the third embodiment is different from that of the second embodiment in that the recognition process on the board mark is performed by the first mounting head.

The configuration of the component mounting system is the same as the configuration shown in the first embodiment. Thus, the detailed description thereof is not repeated here.

Figure 16:
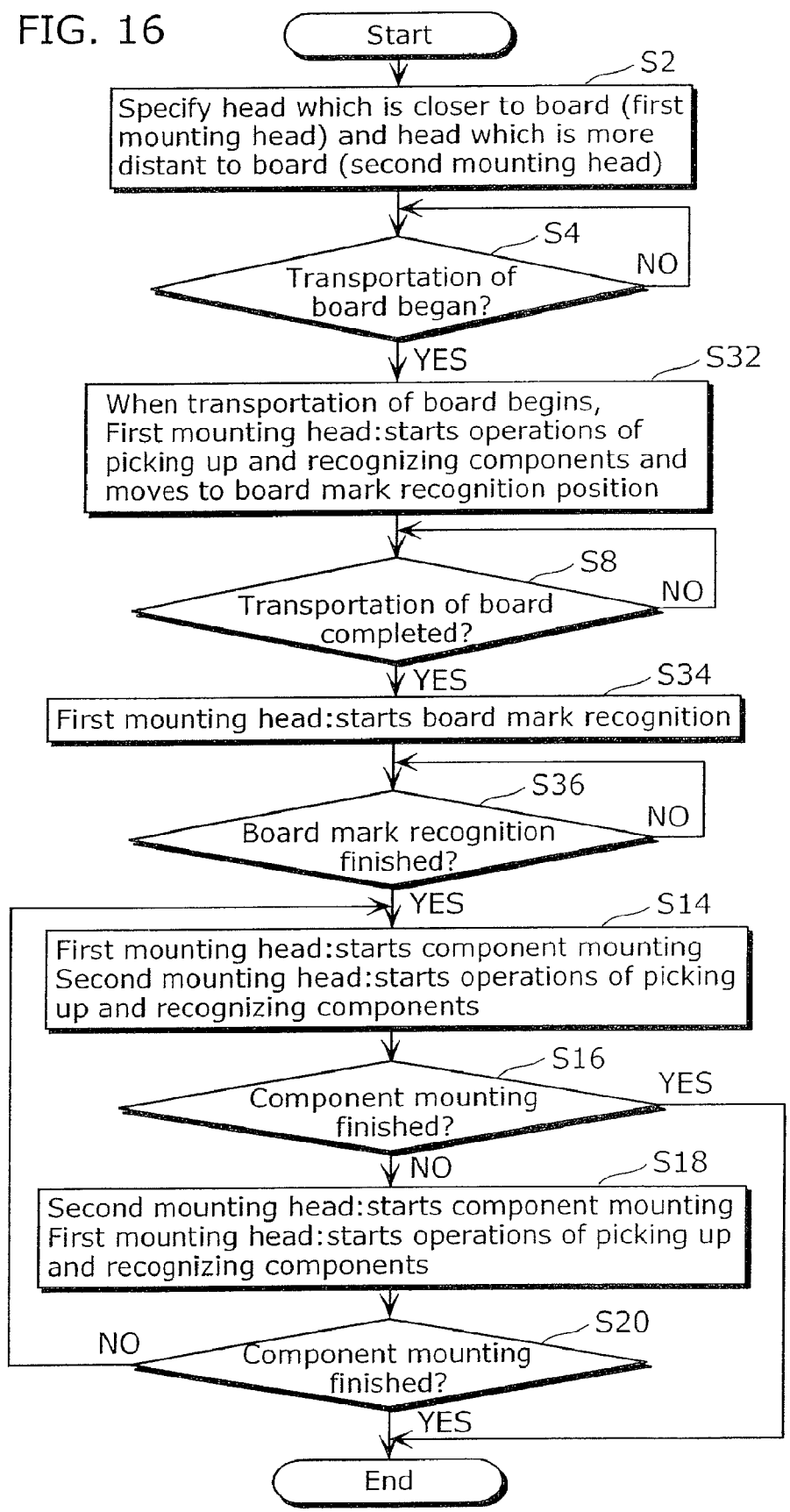
FIG. 16 is a flowchart of a component mounting process performed by a component mounter in accordance with a component mounting condition determined by a component mounting condition determining unit of a component mounting condition determining apparatus.
Figure 17:
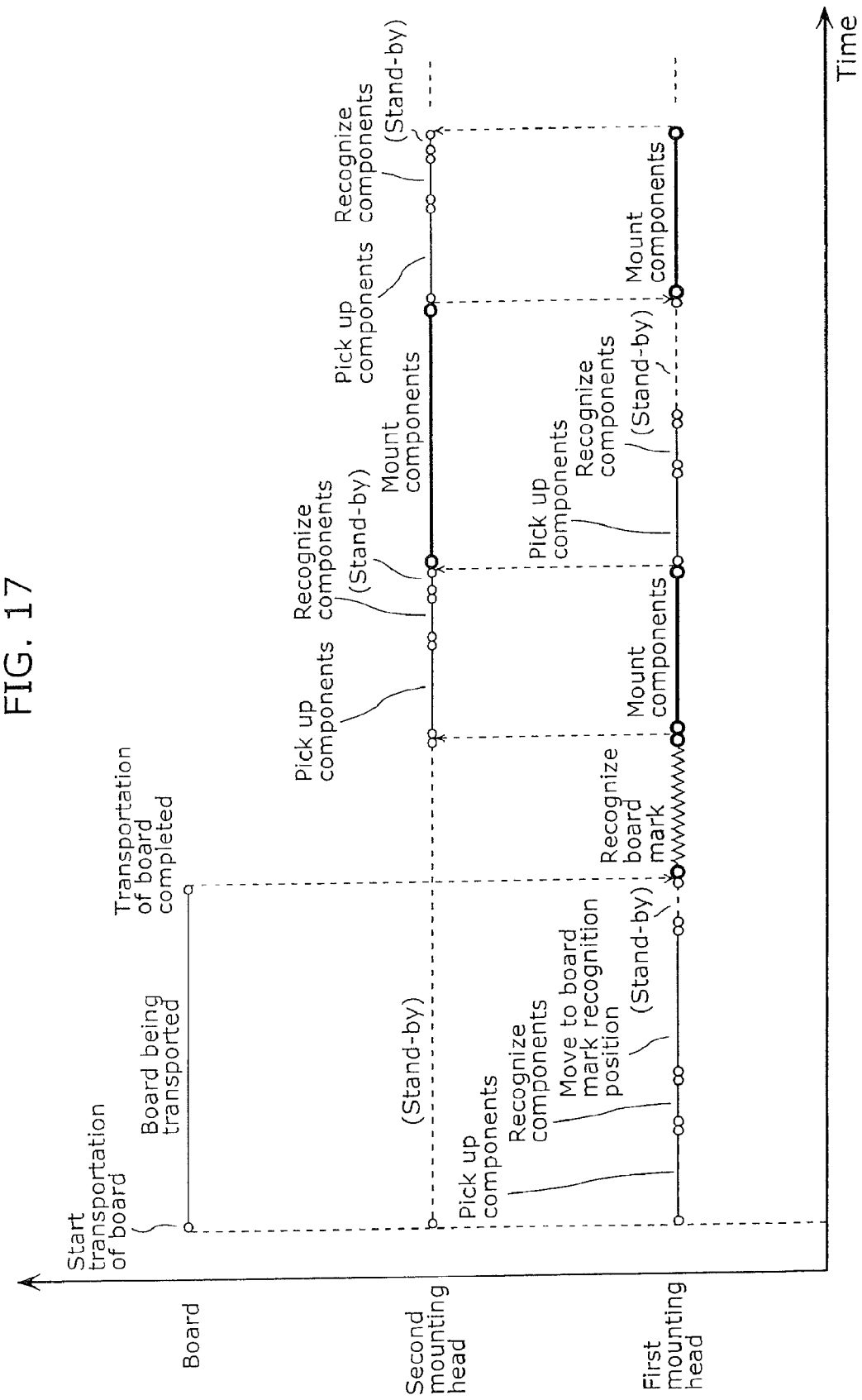
FIG. 17 is a timing chart of a component mounting process performed by a first mounting head and a second mounting head of a component mounter.

FIG. 16 is a flowchart of a component mounting process performed by the component mounter 120 in accordance with a component mounting condition determined by the component mounting condition determining unit 305a of the component mounting condition determining apparatus 300. FIG. 17 is a timing chart of a component mounting process performed by the first to mounting head and the second mounting head of the component mounter 120.

As in the first embodiment, from among the line gang pickup head 121 of the front sub-equipment 120a and the line gang pickup head 121 of the rear sub-equipment 120b, a line gang pickup head which moves a shorter distance to the board 20 in the Y-axis direction is specified as a first mounting head, and a line gang pickup head which moves a longer distance to the board 20 in the Y-axis direction is specified as a second mounting head (S2).

When transportation of the board 20 to the component mounter 120 begins, the first mounting head starts the process of picking up components and the process of recognizing the components, and moves to a predetermined position near board marks 16 provided on the board 20 (S32). Note that the first mounting head may move to a recognition position of the board marks 16.

When the transportation of the board 20 to the component mounter 120 completes (Yes in S8), the first mounting head starts the recognition of the board marks 16 (S34).

When the first mounting head finishes the process of recognizing the board marks 16 (Yes in S36), the processes in S14 through S20 are performed. The processes in S14 through S20 are the same as the processes described in the second embodiment. Thus, the detailed description thereof is not repeated here.

As described above, according to the third embodiment, a component mounting condition is determined such that mounting in a first task (a task which is the first to be performed) is performed by the first mounting head which moves the shorter distance to the board 20 in the Y-axis direction.

As a result, the number of times the second mounting head performs component mounting becomes equal to or one less than the number of times the first mounting head performs component mounting. Therefore, it is possible to reduce the total distance that the first and second mounting heads move to the board 20, and thus the total length of time that the first and second mounting heads take to move to the board 20 can also be reduced. As a result, the length of time that the component mounter 120 takes for mounting components can be reduced.

Further, when transportation of the board 20 begins, the first mounting head moves to a predetermined position near the board marks. Consequently, when the transportation of the board 20 completes, the first mounting head can immediately perform the process of recognizing the board marks. As a result, the length of time that the component mounter 120 takes for mounting components can be reduced.

In the third embodiment, the second mounting head starts the process of picking up components and the process of recognizing the components after the first mounting head finishes the process of recognizing the board marks 16. Note, however, that the second mounting head may start the process of picking up components and the process of recognizing the components before the first mounting head finishes the process of recognizing the board marks 16.

Further, the first mounting head performs the process of picking up components and the process of recognizing the components while the board is being transported. Consequently, when the process of recognizing the board marks finishes, the first mounting head can immediately start the process of component mounting. As a result, the length of time that the component mounter 120 takes for mounting components can be reduced.

Fourth Embodiment

Next, a component mounting system according to a fourth embodiment of the present invention shall be described. In the fourth embodiment, a case example shall be described where the method of determining a mounting condition described in the first embodiment is applied to a component mounter having dual lanes.

The component mounting system according to the present embodiment is the same as the component mounting system 10 shown in FIG. 1, except that the component mounting system according to the present embodiment employs a component mounter having dual lanes instead of the component mounter 120.

Figure 18:
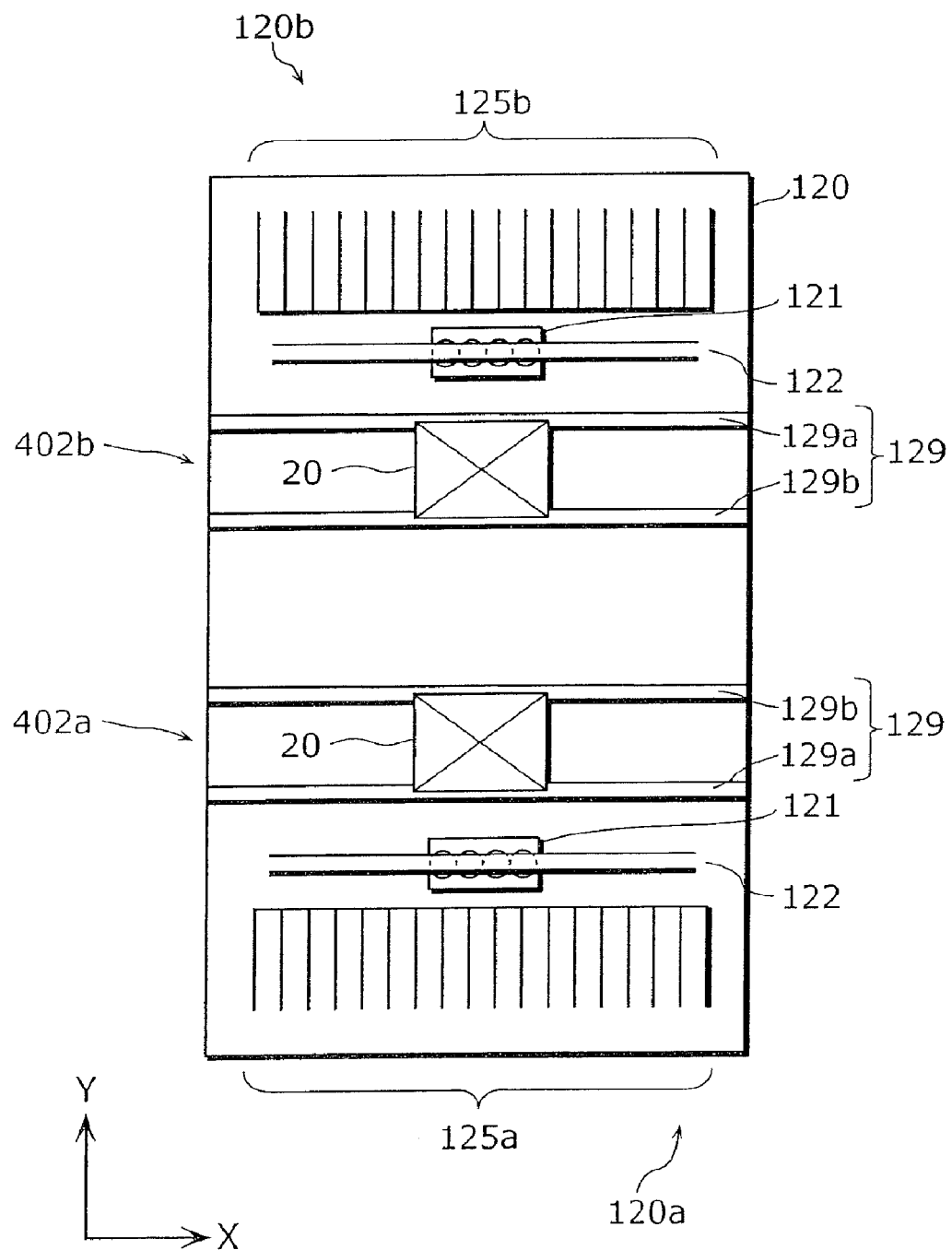
FIG. 18 is a plan view of a component mounter with dual lanes, showing a major inner configuration thereof.

FIG. 18 is a plan view of the component mounter with dual lanes, showing a major inner configuration thereof.

The configuration of the component mounter is the same as that of the component mounter 120 shown in FIG. 2 according to the first embodiment, except that the component mounter in the present embodiment has two pairs of rails 129 placed to be parallel to the direction that the board 20 is transported.

As shown in FIG. 18, rails 129 provided on the front sub-equipment 120a-side are referred to as a first lane 402a, and rails 129 provided on the rear sub-equipment 120b-side are referred to as a second lane 402b. Note that for both of the lanes, a fixed rail 129a is provided on a to side where the line gang pickup head 121 is closer, and a movable rail 129b is provided on a side where the line gang pickup head 121 is more distant.

The component mounter with dual lanes employs two main types of modes for production of a board, namely, a synchronous mode and an asynchronous mode.

In the synchronous mode, component mounting starts after boards 20 are brought in to both of the two lanes (the first lane 402a and the second lane 402b). In other words, component mounting does not start while the board 20 is brought in to only one of the lanes. In the synchronous mode, two line gang pickup heads 121 alternately mount components onto the two boards 20. Note that an order in which the two line gang pickup heads 121 mount components is determined in such a manner that the two boards 20 are considered as one large piece of board 20.

Figure 19:
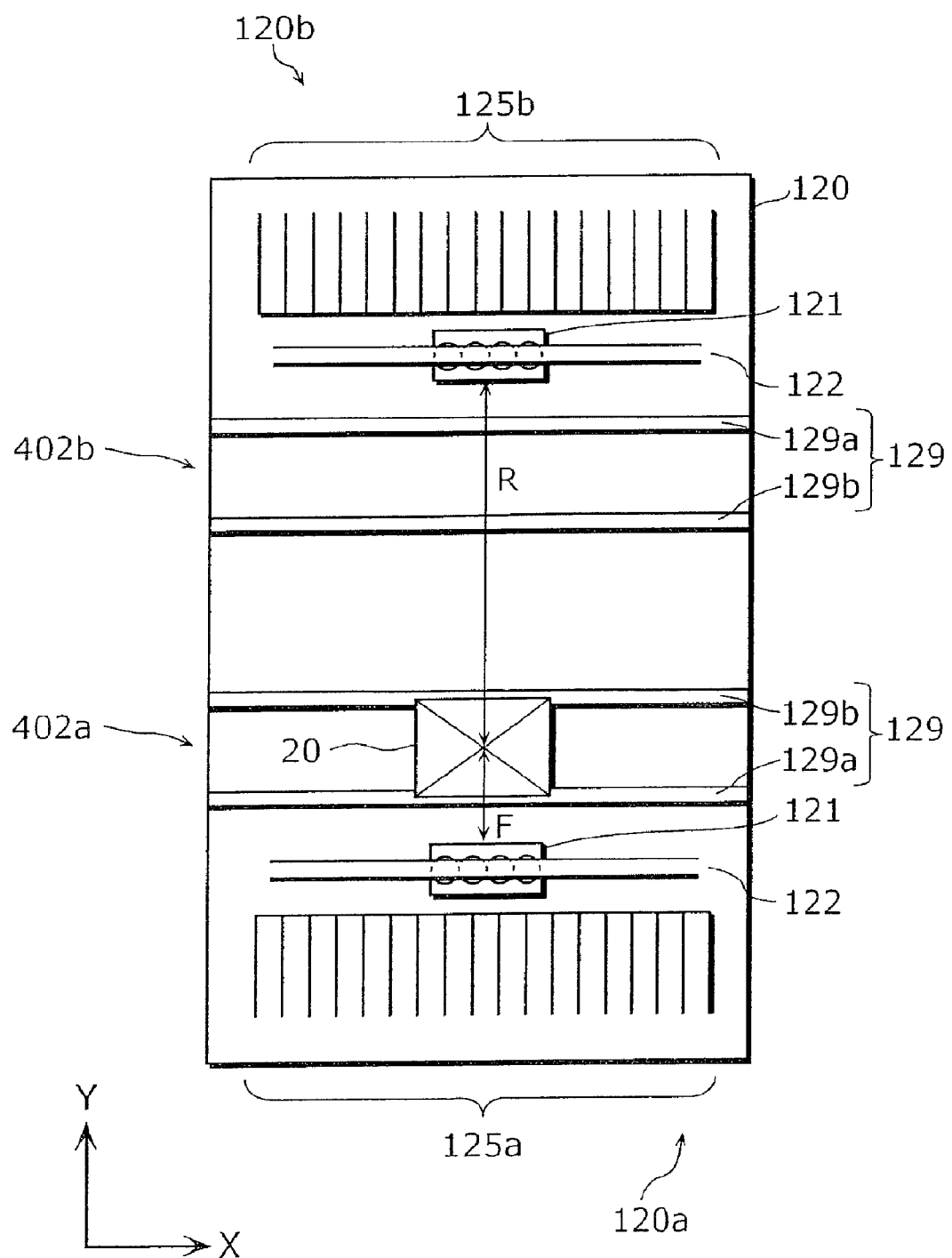
FIG. 19 is a diagram showing an inner state of a component mounter in the case where a board is firstly brought into a first lane.

In the asynchronous mode, component mounting starts after the board 20 is brought in to any one of the two lanes. In the asynchronous mode, the two line gang pickup heads 121 alternately mount components onto one board 20. In other words, in the case where the board 20 is firstly brought in to the first lane 402a as shown in FIG. 19, the two line gang pickup heads 121 alternately mount components onto the board 20 on the first lane 402a in the form of coordinated operation. Further, in the case where the board 20 is firstly brought in to the second lane 402b as shown in FIG. 20, the two line gang pickup heads 121 alternately mount components onto the board 20 on the second lane 402b in the form of coordinated operation.

Next, a description is provided on a method of determining a component mounting condition, performed by the component mounting condition determining unit 305a of the component mounting condition determining apparatus 300. The flowchart of the process performed by the component mounting condition determining unit 305a is the same as the flowchart shown in FIG. 10. For this method, there is an assumption that the component mounter having dual lanes operates in the asynchronous mode.

From among the line gang pickup head 121 of the front sub-equipment 120a and the line gang pickup head 121 of the rear sub-equipment 120b, the component mounting condition determining unit 305a specifies, as a first mounting head, a line gang pickup head which moves a shorter distance in the Y-axis direction between a component supply unit and the board 20, and specifies, as a second mounting head, a line gang pickup head which moves a longer distance in the Y-axis direction between a component supply unit and the board 20 (S101). Here, as shown in FIG. 19, F refers to a distance that the line gang pickup head 121 provided on the front sub-equipment 120a-side moves between the component supply unit 125a and the center of the board 20, and R refers to a distance that the line gang pickup head 121 provided on the rear sub-equipment 120b-side moves between the component supply unit 125b and the center of the board 20. In the case where the board 20 is firstly brought in to the first lane 402a as shown in FIG. 19, the relationship between the distance F and the distance R is F<R. Therefore, the component mounting condition determining unit 305a specifies the line gang pickup head 121 provided on the front sub-equipment 120a-side as the first mounting head, and specifies the line gang pickup head 121 of the rear sub-equipment 120b-side as the second mounting head. The relationship between the distances F and R is F<R because the two fixed rails 129a are respectively provided on the line gang pickup heads 121-sides, and the distance between the fixed rail 129a on the front sub-equipment 120a-side and the component supply unit 125a and the distance between the fixed rail 129a on the rear sub-equipment 120b-side and the component supply unit 125b are equal to each other. The component mounting condition determining unit 305a may be notified of which lane the board 20 is brought in to, via a sensor which detects that the board 20 is brought in to each of the lanes and which outputs the detecting result to the component mounting condition determining unit 305a.

Figure 20:
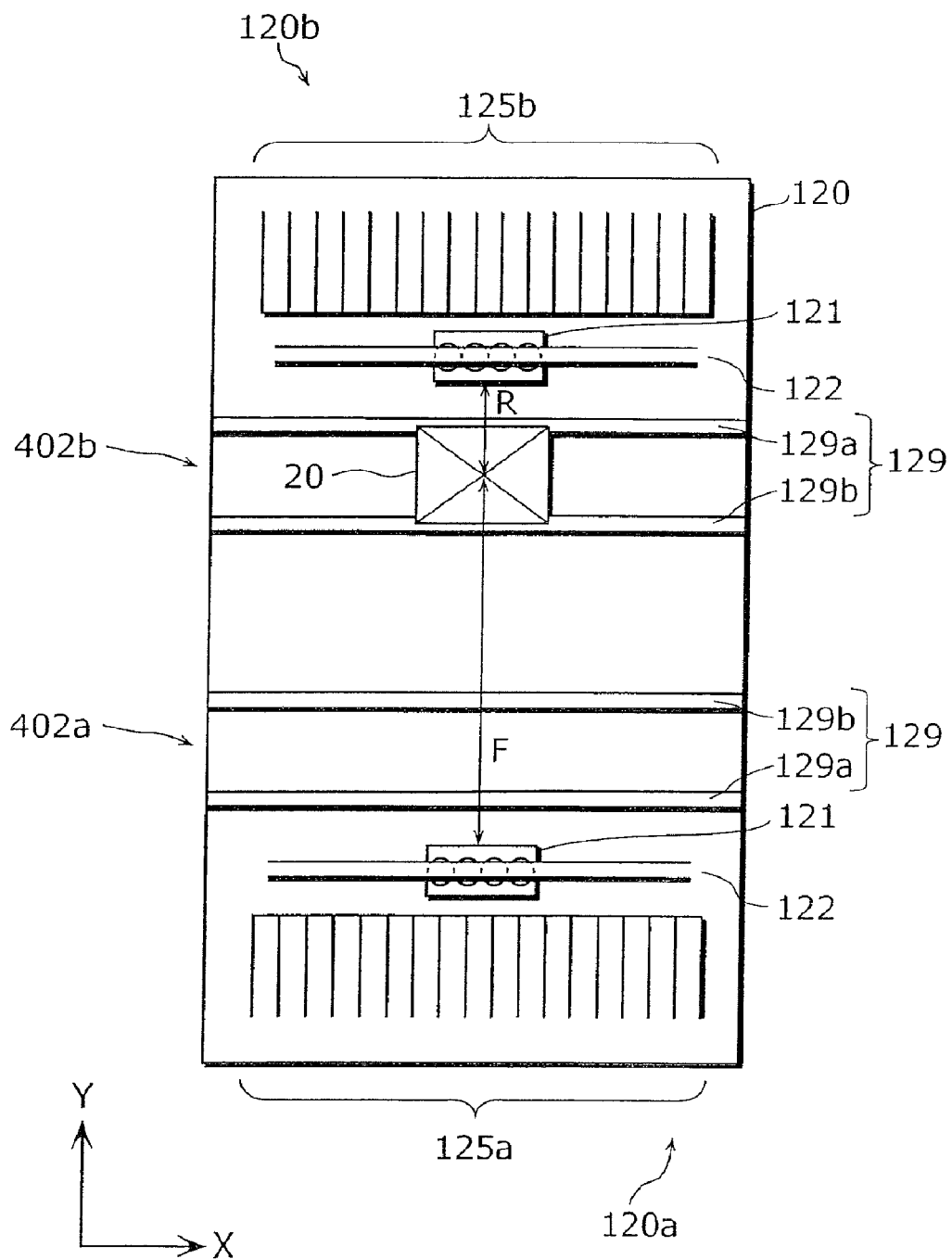
FIG. 20 is a diagram showing an inner state of a component mounter in the case where a board is firstly brought into a second lane.

On the other hand, in the case where the board 20 is firstly brought in to the second lane 402b as shown in FIG. 20, the relationship between the distances F and R is F>R. Therefore, the component mounting condition determining unit 305a specifies the line gang pickup head 121 provided on the rear sub-equipment 120b-side as a first mounting head, and specifies the line gang pickup head 121 provided on the front sub-equipment 120a-side as a second mounting head.

The component mounting condition determining unit 305a determines a component mounting condition such that component mounting starts from the first mounting head (S102).

Figure 21:
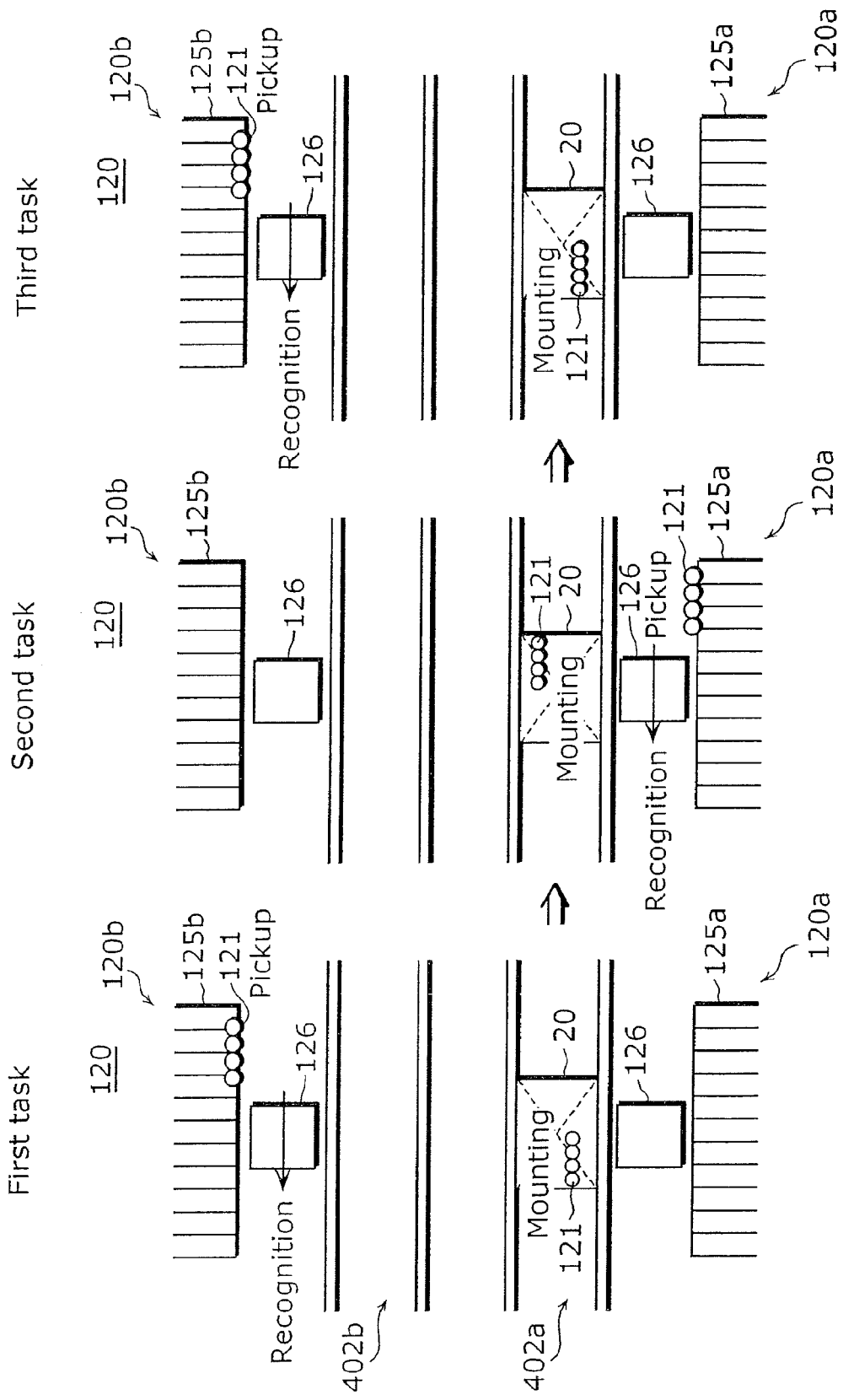
FIG. 21 is a diagram illustrating a mounting order in the case where a board is firstly brought into a first lane.
Figure 22:
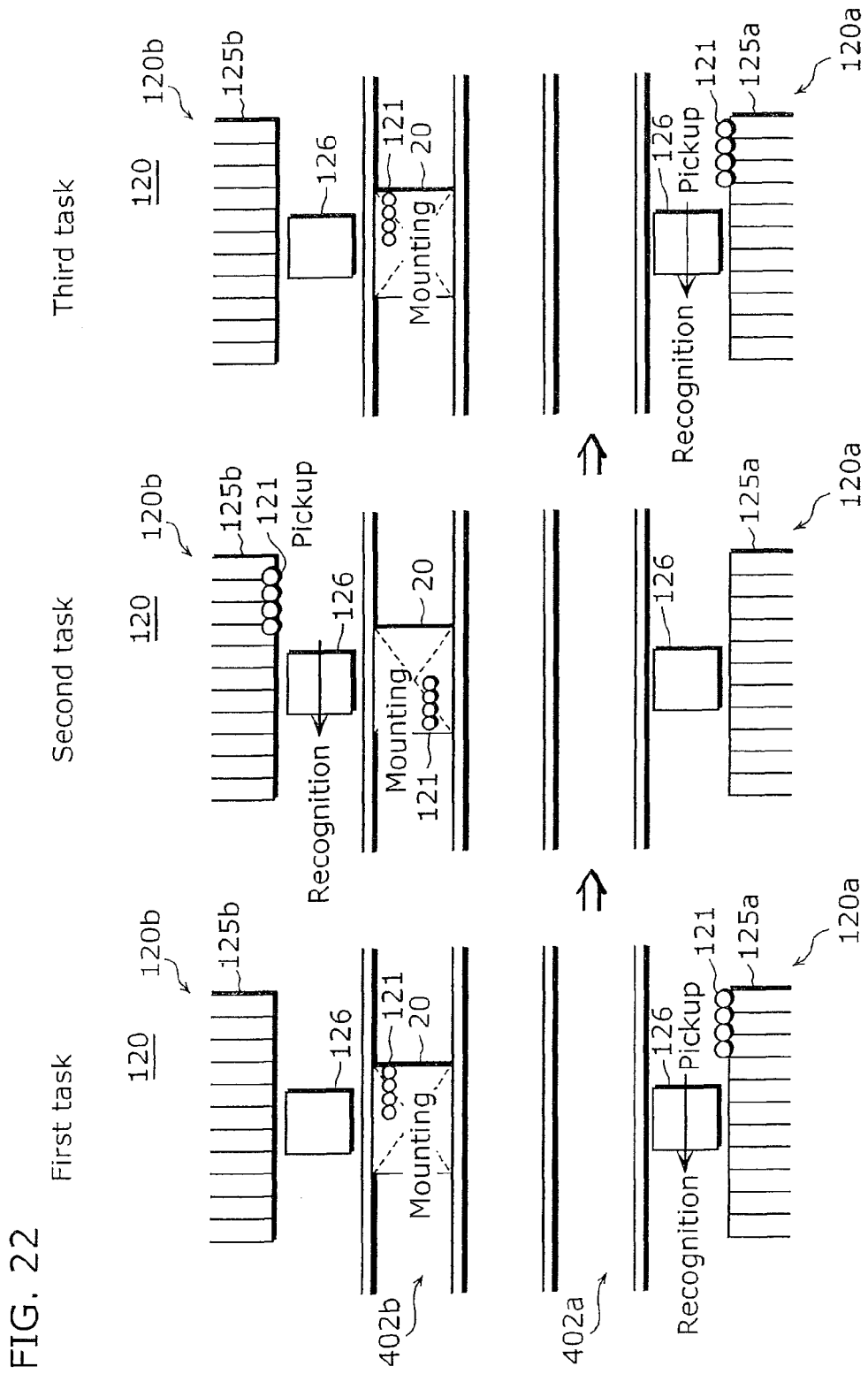
FIG. 22 is a diagram illustrating a mounting order in the case where a board is firstly brought into a second lane.

FIGS. 21 and 22 show exemplary cases where the component mounter operates based on the component mounting condition determined in such manner as described above. In other words, in the case where the board 20 is firstly brought in to the first lane 402a as shown in FIG. 21, the line gang pickup head 121 of the front sub-equipment 120a is specified as a first mounting head, and component mounting starts from the first mounting head. For this reason, in the case where the total number of tasks is an odd number as shown in FIG. 21, the number of tasks of the second mounting head can be arranged to be less than the number of tasks of the first mounting head. By doing so, it is possible to prevent the number of tasks of the second mounting head from being higher than the number of tasks of the first mounting head.

On the other hand, in the case where the board 20 is firstly brought in to the second lane 402b as shown in FIG. 22, the line gang pickup head 121 of the rear sub-equipment 120b is specified as a first mounting head, and component mounting starts from the first mounting head. For this reason, in the case where the total number of tasks is an odd number as shown in FIG. 22, the number of tasks of the second mounting head can be arranged to be less than the number of tasks of the first mounting head. By doing so, it is possible to prevent the number of tasks of the second mounting head from being higher than the number of tasks of the first mounting head.

Figure 23:
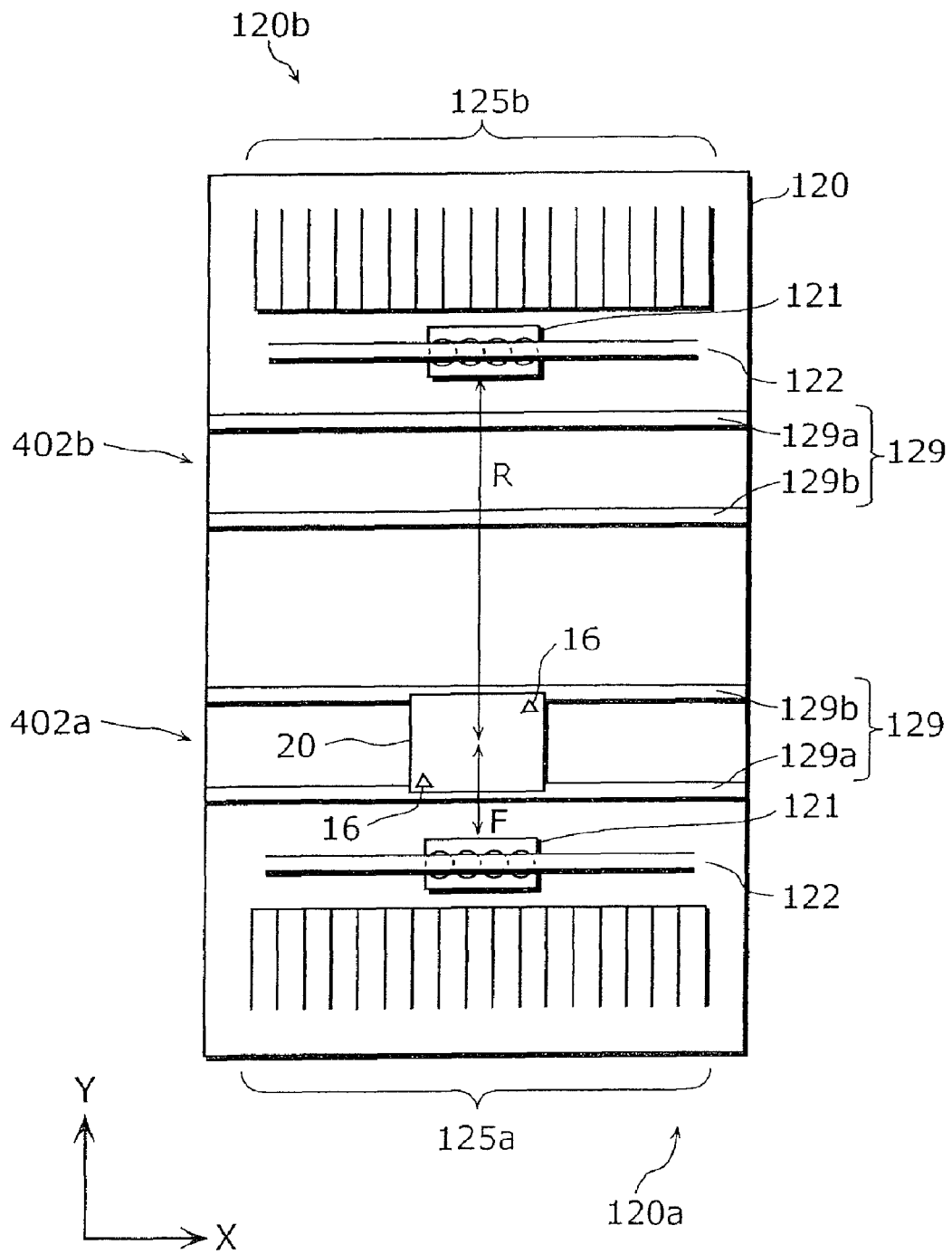
FIG. 23 is a diagram illustrating a process of determining a first mounting head based on a position of a board mark.

Note that a first mounting head is specified based on the position of the lane to which the board 20 is firstly brought in, however, the present invention is not limited to this specifying method. For example, a first mounting head may be specified in the following way, as shown in FIG. 23. The board marks 16 provided on the board 20 are recognized by one of the line gang pickup heads 121 and the positions of the board marks 16 are calculated. Based on the calculated positions of the board marks 16, the distances F and R are calculated. In the case where the relationship between the distances F and R is F≦R, the line gang pickup head 121 of the front sub-equipment 120a is specified as a first mounting head. In the case where the relationship between the distances F and R is F>R, the line gang pickup head 121 of the rear sub-equipment 120b is specified as a first mounting head.

In the present embodiment, a component mounting condition of the component mounter is determined based on the assumption that the component mounter is a component mounter with dual lanes. However, the number of lanes is not limited to this. The present invention can also be applied to a component mounter with three or more lanes.

Fifth Embodiment

Next, a component mounting system according to a fifth embodiment of the present invention shall be described. In the fifth embodiment, with reference to FIGS. 24 and 25, a description shall be provided on, with regard to the method of determining a mounting condition described in the first embodiment, a method of determining a mounting condition with consideration of nozzle exchange, and a detailed mounting operation performed based on a mounting condition determined by the above-mentioned method. In the present embodiment, a case example shall be described where a first mounting head performs nozzle exchange. In this case, a second mounting head which does not perform nozzle exchange performs the process of recognizing a board mark. Note that the first mounting head may perform the process of recognizing a board mark and the second mounting head may perform nozzle exchange.

With the component mounter 120, there are cases where exchange of pickup nozzles is performed during component mounting. In such cases, the pickup nozzles need to be exchanged during a time period from when component mounting onto a board is completed to when component mounting onto the next board starts, in order to bring back to an initial condition.

For this reason, in the case where only one of the line gang pickup heads 121 needs exchange of pickup nozzles, the component mounting condition determining unit 305a determines a component mounting condition such that the exchange of pickup nozzles is performed for the one of the line gang pickup heads 121 and the other one of the line gang pickup heads 121 performs the process of recognizing the board marks 16 in parallel to the exchange of the pickup nozzles.

The following shall describe a method of determining a component mounting condition for a case where the component mounter 120 operates on a board to be produced after a second board, according to a component mounting condition determined by the component mounting condition determining unit 305a. To be more specific, the component mounting condition determining unit 305a determines a component mounting condition such that the component mounter 120 operates in the manner described below.

Figure 24:
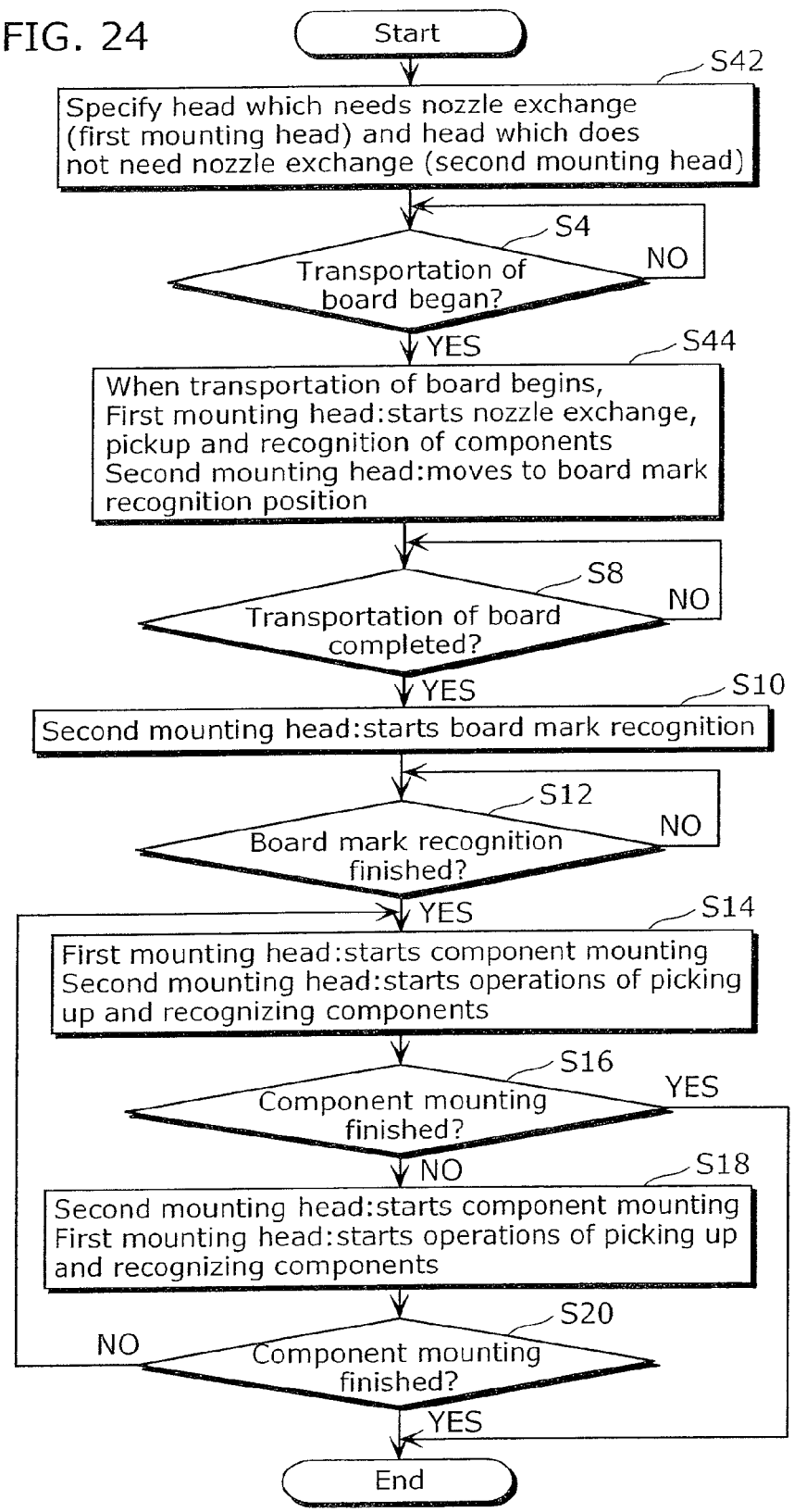
FIG. 24 is a flowchart of a component mounting process performed by a component mounter in accordance with a component mounting condition determined by a component mounting condition determining unit of a component mounting condition determining apparatus.
Figure 25:
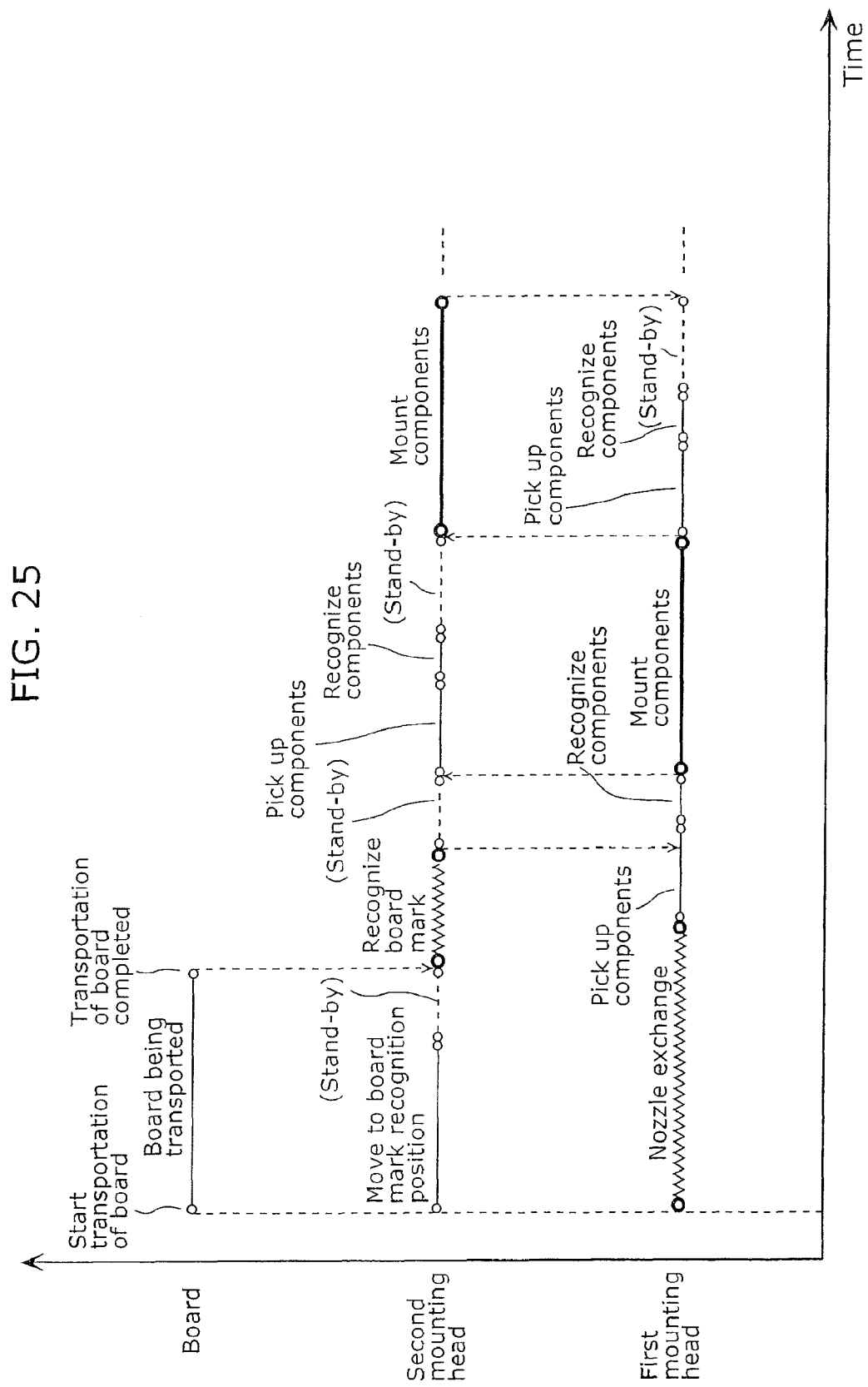
FIG. 25 is a timing chart of a component mounting process performed by a first mounting head and a second mounting head of a component mounter.

FIG. 24 is a flowchart of a component mounting process that the component mounter 120 performs on a board to be produced after the second board, in accordance with a component mounting condition determined by the component mounting condition determining unit 305a of the component mounting condition determining apparatus 300. Further, FIG. 25 is a timing chart of a component mounting process performed by a first mounting head and a second mounting head of the component mounter 120.

First, from among the line gang pickup head 121 of the front sub-equipment 120a and the line gang pickup head 121 of the rear sub-equipment 120b, a line gang pickup head 121 which needs nozzle exchange in order to bring back to the initial condition is specified as a first mounting head, and a line gang pickup head 121 which does not need nozzle exchange is specified as a second mounting head (S42).

When transportation of the board 20 to the component mounter 120 begins (Yes in S4), the first mounting head starts a set of processes including a process of exchanging nozzles, a process of picking up components and a process of recognizing the components, and the second mounting head moves to a predetermined position near a board mark provided on the board 20 (S44). Note that the second mounting head may move to a recognition position of the board mark.

When the transportation of the board 20 to the component mounter 120 completes (Yes in S8), the second mounting head starts the recognition of the board marks 16 (S10).

When the second mounting head finishes the process of recognizing the board marks 16 (Yes in S12), the processes in S14 through S20 are performed. The processes in S14 through S20 are the same as the processes described in the second embodiment. Thus, the detailed description thereof is not repeated here.

By determining a mounting condition in the manner as described above, it is possible to perform in parallel the process of exchanging pickup nozzles for bringing back to the initial condition and the process of recognizing the board marks 16. As a result, each time-consuming work can be assigned to a different mounting head, and thus it is possible to equalize the work between the mounting heads and reduce the length of time that the component mounter 120 takes for mounting components. In addition, after the process of recognizing the board marks 16 finishes, the process of mounting components can immediately start.

In the fifth embodiment, it is assumed that nozzle exchange occurs only with the first mounting head. The following shall describe a process of task generation and a process or task allocation such that nozzle exchange occurs only with the first mounting head.

Figure 26:
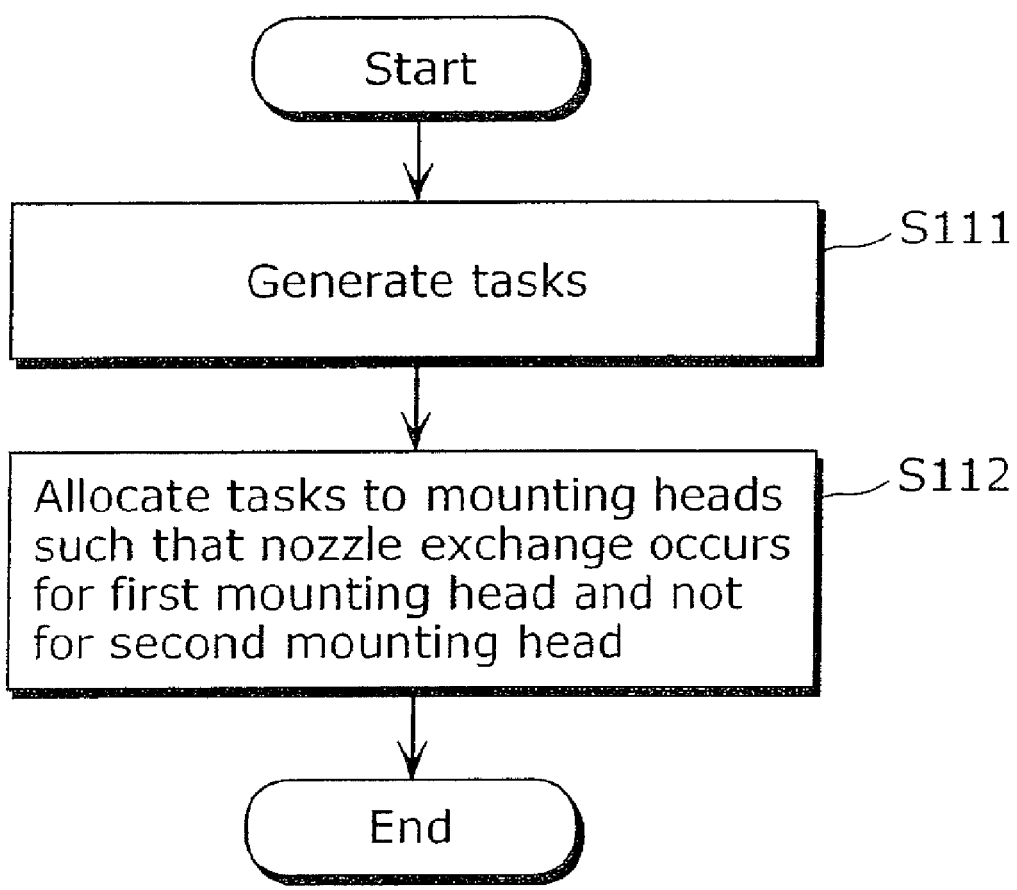
FIG. 26 is a flowchart of a process of task generation.

FIG. 26 is a flowchart of the process of task generation.

The component mounting condition determining unit 305*a* generates tasks that the length of time for mounting components is minimized (S111). The process of task generation is not specifically described here, since there are various techniques suggested for the process and it is not the focus of the present application.

The component mounting condition determining unit 305*a* allocates generated tasks to each of the line gang pickup heads 121 such that nozzle exchange occurs for the line gang pickup head 121 of the front sub-equipment 120*a* and not for the line gang pickup head 121 of the rear sub-equipment 120*b* (S112).

Note that the component mounting condition determining unit 305*a* may allocate tasks to each of the line gang pickup heads 121 by performing the process of specifying first and second mounting heads (S101) prior to the process of task generation (S111) such that in the process of allocating tasks (S112), nozzle exchange occurs for the first mounting head and not for the second mounting head. Furthermore, the component mounting condition determining unit 305*a* may allocate tasks to each of the line gang pickup heads 121 such that nozzle exchange occurs for the second mounting head 121 and not for the first mounting head.

As described above, a component mounting system according to the embodiments of the present invention has been provided, but the present invention is not limited to the above described embodiments.

For example, although the component mounter 120 in the above described embodiments includes two line gang pickup heads 121, the component mounter 120 may include three or more line gang pickup heads 121. In such a case, from among the three or more line gang pickup heads 121, a line gang pickup head 121 which moves the shortest distance between a component supply unit and the board 20 can be specified as a first mounting head, and component mounting can start from the first mounting head.

The above disclosed embodiments are intended to illustrate the present invention and are not to be considered as limitations of the present invention. The scope of the present invention is represented by Claims and not by the above provided description, and is intended to include equivalent meaning of the Claims and all modifications within the scope.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be applied to methods for component mounting used for component mounters that produce circuit boards, and in particular, to methods such as methods for component mounting used for so-called alternate mounting component mounters.

The invention claimed is:

1. A method for component mounting used for a component mounter including plural mounting heads which alternately mount components onto a board, said method comprising:

specifying, after obtaining respective distances that the plural mounting heads move to the board, one of the plural mounting heads which moves a shorter distance to the board than any other of the plural mounting heads as a first mounting head; and mounting the components with alternating ones of the plural mounting heads onto the board which is brought into the component mounter, said mounting beginning with the first mounting head.

2. The method for component mounting according to claim 1, wherein said specifying includes specifying, as a second mounting head, another one of the plural mounting heads which is different from the first mounting head, and wherein said mounting includes:

recognizing a board mark provided on the board so as to obtain an amount of correction of a component mounting position, said recognizing being performed by the second mounting head; and performing said mounting of the components onto the board using the amount of correction after said recognizing.

3. The method for component mounting according to claim 1, wherein said mounting includes:

recognizing a board mark provided on the board so as to obtain an amount of correction of a component mounting position, said recognizing being performed by the first mounting head; and performing said mounting of the components onto the board using the amount of correction after said recognizing.

4. The method for component mounting according to claim 1, wherein said specifying includes specifying, as a non-exchange mounting head, one of the plural mounting heads for which no exchange of pickup nozzles occurs when the components are mounted onto the board, the pickup nozzles being used for picking up the components supplied to the plural mounting heads, and wherein said mounting further includes recognizing a board mark provided on a board to be produced after a first board, said recognizing being performed by the non-exchange mounting head.

5. The method for component mounting according to claim 1,
wherein the component mounter further includes plural lanes for bringing respective boards inside the component mounter,
for each of the lanes, a corresponding one of the plural mounting heads is predetermined as moving a shorter distance to the lane than any other of the mounting heads, and
wherein said specifying comprises specifying, as the first mounting head, the predetermined mounting head which corresponds to the lane which brings a first one of the boards into the component mounter.

* * * * *